(12) United States Patent
Lemmi et al.

(10) Patent No.: US 7,767,102 B2
(45) Date of Patent: Aug. 3, 2010

(54) SYSTEMS AND METHODS FOR HARVESTING AND INTEGRATING NANOWIRES

(75) Inventors: Francesco Lemmi, Sunnyvale, CA (US); David P. Stumbo, Belmont, CA (US)

(73) Assignee: Nanosys, Inc., Palo Alto, CA (US)

( * ) Notice: Subject to any disclaimer, the term of this patent is extended or adjusted under 35 U.S.C. 154(b) by 524 days.

(21) Appl. No.: 11/839,778

(22) Filed: Aug. 16, 2007

(65) Prior Publication Data

US 2008/0041814 A1 Feb. 21, 2008

Related U.S. Application Data

(62) Division of application No. 11/117,707, filed on Apr. 29, 2005, now Pat. No. 7,339,184.

(60) Provisional application No. 60/586,170, filed on Jul. 7, 2004, provisional application No. 60/605,454, filed on Aug. 30, 2004, provisional application No. 60/653,574, filed on Feb. 16, 2005.

(51) Int. Cl.
*H01B 13/00* (2006.01)
(52) U.S. Cl. .................. 216/13; 216/20; 438/1; 438/3; 438/105; 438/142; 438/384
(58) Field of Classification Search .......... 216/13, 216/20; 438/1, 3, 105, 142, 384; 977/888
See application file for complete search history.

(56) References Cited

U.S. PATENT DOCUMENTS 5,196,396 A 3/1993 Lieber et al.
5,252,835 A 10/1993 Lieber et al.
5,274,602 A 12/1993 Glen et al.
5,332,910 A 7/1994 Haraguchi et al.

(Continued)

FOREIGN PATENT DOCUMENTS

KR 1020040092583 11/2004

(Continued)

OTHER PUBLICATIONS

Zhou, C. et al., "Nanoscale metal/self-assembled monolayer/metal heterostructures" Applied Phys. Lett (1997) 71:611-613.

(Continued)

*Primary Examiner*—Barbara L Gilliam
*Assistant Examiner*—Mahmoud Dahimene
(74) *Attorney, Agent, or Firm*—Andrew L. Filler

(57) ABSTRACT

The present invention is directed to methods to harvest, integrate and exploit nanomaterials, and particularly elongated nanowire materials. The invention provides methods for harvesting nanowires that include selectively etching a sacrificial layer placed on a nanowire growth substrate to remove nanowires. The invention also provides methods for integrating nanowires into electronic devices that include placing an outer surface of a cylinder in contact with a fluid suspension of nanowires and rolling the nanowire coated cylinder to deposit nanowires onto a surface. Methods are also provided to deposit nanowires using an ink-jet printer or an aperture to align nanowires. Additional aspects of the invention provide methods for preventing gate shorts in nanowire based transistors. Additional methods for harvesting and integrating nanowires are provided.

12 Claims, 13 Drawing Sheets

U.S. PATENT DOCUMENTS

| | | | |
|---|---|---|---|
| 5,338,430 | A | 8/1994 | Parsonage et al. |
| 5,505,928 | A | 4/1996 | Alivisatos et al. |
| 5,512,131 | A | 4/1996 | Kumar et al. |
| 5,640,343 | A | 6/1997 | Gallagher et al. |
| 5,674,592 | A | 10/1997 | Clark et al. |
| 5,690,807 | A | 11/1997 | Clark, Jr. et al. |
| 5,751,018 | A | 5/1998 | Alivisatos et al. |
| 5,840,435 | A | 11/1998 | Lieber et al. |
| 5,858,862 | A | 1/1999 | Westwater et al. |
| 5,897,945 | A | 4/1999 | Lieber et al. |
| 5,899,734 | A | 5/1999 | Lee |
| 5,953,595 | A | 9/1999 | Gosain et al. |
| 5,962,863 | A | 10/1999 | Russell et al. |
| 5,976,957 | A | 11/1999 | Westwater et al. |
| 5,990,479 | A | 11/1999 | Weiss et al. |
| 5,997,832 | A | 12/1999 | Lieber et al. |
| 6,004,444 | A | 12/1999 | Aksay et al. |
| 6,036,774 | A | 3/2000 | Lieber et al. |
| 6,048,616 | A | 4/2000 | Gallagher et al. |
| 6,128,214 | A | 10/2000 | Kuekes et al. |
| 6,136,156 | A | 10/2000 | El-Shall et al. |
| 6,159,742 | A | 12/2000 | Lieber et al. |
| 6,190,634 | B1 | 2/2001 | Lieber et al. |
| 6,207,229 | B1 | 3/2001 | Bawendi et al. |
| 6,225,198 | B1 | 5/2001 | Alivisatos et al. |
| 6,235,675 | B1 | 5/2001 | McIlroy |
| 6,248,674 | B1 | 6/2001 | Kamins et al. |
| 6,256,767 | B1 | 7/2001 | Kuekes et al. |
| 6,274,007 | B1 | 8/2001 | Smirnov et al. |
| 6,306,736 | B1 | 10/2001 | Alivisatos et al. |
| 6,322,901 | B1 | 11/2001 | Bawendi et al. |
| 6,380,103 | B2 | 4/2002 | Gonzalez et al. |
| 6,383,923 | B1 | 5/2002 | Brown et al. |
| 6,413,489 | B1 | 7/2002 | Ying et al. |
| 6,438,025 | B1 | 8/2002 | Skarupo |
| 6,447,663 | B1 | 9/2002 | Lee et al. |
| 6,471,761 | B2 | 10/2002 | Fan et al. |
| 6,566,704 | B2 | 5/2003 | Choi et al. |
| 6,586,785 | B2 | 7/2003 | Flagan et al. |
| 6,760,245 | B2 | 7/2004 | Eaton et al. |
| 6,773,616 | B1 | 8/2004 | Chen et al. |
| 6,798,000 | B2 | 9/2004 | Luyken et al. |
| 6,815,218 | B1 | 11/2004 | Jacobson et al. |
| 6,815,750 | B1 | 11/2004 | Kamins |
| 6,831,017 | B1 | 12/2004 | Li et al. |
| 6,858,455 | B2 | 2/2005 | Guillom et al. |
| 6,872,645 | B2 | 3/2005 | Duan et al. |
| 6,878,871 | B2 | 4/2005 | Scher et al. |
| 6,882,051 | B2 | 4/2005 | Majumdar et al. |
| 7,446,014 | B2 * | 11/2008 | Zhang et al. ............... 438/399 |
| 2001/0023986 | A1 | 9/2001 | Mancevski |
| 2002/0005876 | A1 | 1/2002 | Grimes et al. |
| 2002/0014667 | A1 | 2/2002 | Shin et al. |
| 2002/0104762 | A1 | 8/2002 | Stonas et al. |
| 2002/0117659 | A1 | 8/2002 | Lieber et al. |
| 2002/0125192 | A1 | 9/2002 | Lopez et al. |
| 2002/0127495 | A1 | 9/2002 | Scherer |
| 2002/0130311 | A1 | 9/2002 | Lieber et al. |
| 2002/0130353 | A1 | 9/2002 | Lieber et al. |
| 2002/0158342 | A1 | 10/2002 | Tuominen et al. |
| 2002/0163079 | A1 | 11/2002 | Awano |
| 2002/0175408 | A1 | 11/2002 | Majumdar et al. |
| 2003/0012723 | A1 | 1/2003 | Clarke |
| 2003/0042562 | A1 | 3/2003 | Giebeler et al. |
| 2003/0044777 | A1 | 3/2003 | Beattie |
| 2003/0049875 | A1 | 3/2003 | Sheu et al. |
| 2003/0071246 | A1 | 4/2003 | Grigorov et al. |
| 2003/0089899 | A1 | 5/2003 | Lieber et al. |
| 2003/0186522 | A1 | 10/2003 | Duan et al. |
| 2003/0189202 | A1 | 10/2003 | Li et al. |
| 2004/0005258 | A1 | 1/2004 | Fonash et al. |
| 2004/0026684 | A1 | 2/2004 | Empedocles |
| 2004/0031975 | A1 | 2/2004 | Kern et al. |
| 2004/0036126 | A1 | 2/2004 | Chau et al. |
| 2004/0036128 | A1 | 2/2004 | Zhang et al. |
| 2004/0061422 | A1 | 4/2004 | Avouris et al. |
| 2004/0095658 | A1 | 5/2004 | Buretea et al. |
| 2004/0112964 | A1 | 6/2004 | Empedocles et al. |
| 2004/0135951 | A1 | 7/2004 | Stumbo et al. |
| 2004/0146560 | A1 | 7/2004 | Whiteford et al. |
| 2005/0064618 | A1 | 3/2005 | Brown et al. |
| 2005/0066883 | A1 | 3/2005 | Dubrow et al. |
| 2005/0079659 | A1 | 4/2005 | Duan et al. |
| 2005/0145596 | A1 | 7/2005 | Metz et al. |
| 2005/0176245 | A1 | 8/2005 | Melechko et al. |
| 2005/0279274 | A1 | 12/2005 | Niu et al. |

FOREIGN PATENT DOCUMENTS

| | | |
|---|---|---|
| WO | 9629629 | 9/1996 |
| WO | 0103208 | 1/2001 |
| WO | 0217362 | 2/2002 |
| WO | 0248701 | 6/2002 |
| WO | 02080280 | 10/2002 |
| WO | 03085700 | 10/2003 |
| WO | 03085701 | 10/2003 |
| WO | 2004032191 | 4/2004 |
| WO | 2004032193 | 4/2004 |
| WO | 2005023923 | 3/2005 |

OTHER PUBLICATIONS

Bachtold A. et al. "Logic Circuits with Carbon Nanotube Transistors" Science (2001) 294:1317-1320.

Bjork M.T. et al. "One-dimensional steeplechase for electrons realized" Nano Letters (2002) 2:86-90.

Cao Y. et al. "Growth and properties of semiconductor core/shell nanocrystals with InAs cores" J. Am. Chem. Soc. (2000) 122:9692-9702.

Chen J. et al. "Observation of a Large On-Off Ratio and Negative Differential Resistance in an Electronic Molecular Switch" Science (1999) 286:1550-1552.

Chung S-W. et al. "Silicon Nanowire Devices" App. Phys. Letts. (2000) 76(15):2068-2070.

Collier C.P. et al. "Electronically Configurable Molecular-Based Logic Gates" Science (1999) 285:391-394.

Cui Y. et al. "Doping and electrical transport in silicon nanowires" J. Phys. Chem. B (2000) 104:5213-5216.

Cui Y. et al. "Diameter-controlled synthesis of single-crystal silicon nanowires" Appl. Phys. Lett. (2001) 78:2214-2216.

Cui Y. et al. "Functional Nanoscale electronic devices assembled using silicon nanowire building blocks." Science (2001) 291:851-853.

Dabbousi B.O. et al. "(CdSe)ZnS core-shell quantum dots: Synthesis and characterization of a size series of highly luminescent nanocrysallites" J. Phys. Chem. B (1997) 101:9463-9475.

Derycke V. et al. "Carbon Nanotube Inter-and Intramolecular Logic Gates" Nano Letters (2001) 1(9):453-456.

Duan X. et al. "General synthesis of compound semiconductor nanowires" Adv. Mater. (2000) 12:298-302.

Duan X. et al. "High performance thin-film transistors using semiconductor nanowires and nanoribbons" Nature (2003) 425:274-278.

Greene L. et al. "Low-temperature wafer scale production of ZnO nanowire arrays" Angew. Chem. Int. Ed. (2003) 42:3031-3034.

Givargizov E.I. "Fundamental Aspects of VLS Growth" J. Cryst. Growth (1975) 31:20-30.

Gudiksen M.S. et al "Diameter-selective synthesis of semiconductor nanowires" J. Am. Chem. Soc. (2000) 122:8801-8802.

Gudiksen M.S. et al. "Synthetic control of the diameter and length of single crystal semiconductor nanowires" J. Phys. Chem. B (2001) 105:4062-4064.

Gudiksen M.S. et al. "Growth of nanowire superlattice structures for nanoscale photonics and electronics" Nature (2002) 415:617-620.

Haraguchi K. et al. "Polarization Dependence of Ligh Emitted from GaAs p-n junctions in quantum wire crystals" J. Appl. Phys. (1994) 75(8):4220-4225.

Haraguchi K. et al. "Self Organized Fabrication of Planar GaAs Nanowhisker Arrays" Appl. Phys. Lett. (1996) 69 (3):386-387.

Hiruma K. et al. "GaAs Free Standing Quantum Sized Wires" J. Appl. Phys. (1993) 74(5):3162-3171.

Hwang J. et al. "Al2O3 nanotubes fabricated by wet etching of ZnO/Al2O3 core/shell nanofibers" Adv. Mat. (2004) 16 (5):422-425.

Huang Y. et al. "Directed Assembly of One-Dimensional Nanostructures into Functional networks" Science (2001) 291:630-633.

Huang Y. et al. "Logic Gates and Computation from Assembed Nanowire Building Blocks" Science (2001) 294:1313-1317.

Jun Y-W. et al. "Controlled synthesis of multi-armed CdS nanorod architectures using monosurfactant system" J. Am. Chem. Soc. (2001) 123:5150-5151.

Kong J. et al. "Synthesis of individual single-walled carbon nanotubes on patterned silicon wafers" Nature (1998) 395:878-881.

Kong J. et al. "Chemical vapor deposition of methane for single-walled carbon nanotubes" Chem. Phys. Lett.(1998) 292:567-574.

Kong J. et al. "Nanotube molecular wires as chemical sensors" Science (2000) 287:622-625.

Liu C. et al. "Sol-Gel Synthesis of Free-Standing Ferroelectric Lead Zirconate Titanate Nanoparticles" J. Am. Chem. Soc. (2001) 123:4344-4345.

Manalis S.F. et al. "Microvolume field-effect pH sensor for the scanning probe microscope" Applied Phys. Lett. (2000) 76:1072-1074.

Manna L. et al. "Synthesis of Soluble and Processable Rod-Arrow-Teardrop- and Tetrapod-Shaped CdSe Nanocrystals" J. Am. Chem. Soc. (2000) 122:12700-12706.

Manna L. et al. "Epitaxial growth and photochemical annealing of graded CdS/ZnS shells on colloidal CdSe nanorods" J. Am. Chem. Soc. (2002) 124:7136-7145.

Morales A.M. et al. "A laser ablation method for the synthesis of crystalline semiconductor nanowires" Science (1998) 279:208-211.

Peng X et al. "Epitaxial growth of highly luminescent CdSe/CdS core/shell nanocrystals with photostability and electronic accessibility" J. Am. Chem. Soc. (1997) 119:7019-7029.

Peng X. et al. "Shape Control of CdSe Nanocrystals" Nature (2000) 404:59-61.

Puntes V.F. et al. "Colloidal nanocrystal shape and size control: The case of cobalt" Science (2001) 291:2115-2117.

Schon J.H. et al. "Field-effect modulation of the conductance of single molecules." Science (2001) 294:2138-2140.

Schon J.H. et al. "Self-assembled monolayer organic field-effect transistors" (2001) Nature 413:713-716.

Service R.F. "Assembling nanocircuits from the bottom up" Science (2001) 293:782-785.

Tang et al. "Synthesis of InN Nanowires Using a Two-Zone Chemical Vapor Deposition Approach" IEEE (Aug. 14, 2003) 205-207.

Tans S.J. et al. "Room-temperature transistor based on a single carbon nanotube" Nature (1998) 393:49-52.

Thess A. et al. "Crystalline ropes of metallic carbon nanotubes" (1996) Science 273:483-486.

Tseng G.Y. et al. "Toward nanocomputers" (2001) Science 294:1293-1294.

Urban J.J. et al. "Synthesis of single-crystalline perovskite nanowires composed of barium titanate and strontium titanate" J. Am. Chem. Soc. (2002) 124(7):1186-1187.

Wagner R.S. et al. "Vapor-Liquid-Solid mechanism of single crystal growth" Appl. Phys. Lett. (1964) 4(5):89-90.

Wang et al. "Low Temperature Synthesis of Single-Crystal Germanium Nanowires by Chemical Vapor Deposition" Angew. Chem. Int. Ed. (2002) 41(24):4783-4786.

Wu Y et al. "Block-by-block growth of single-crystalline Si/SiGe superlattice nanowires" Nano Letters (2002) 2(2):83-86.

Yamada T. "Analysis of submicron carbon nanotube field-effect transistors" Appl. Phys Letts (2000) 76(5):628-630.

Yazawa M. et al. "Semiconductor nanowhiskers" Adv. Mater.(1993) 5(7/8):577-580.

Yun W.S. et al. "Ferroelectric Properties of Individual Barium Titanate Nanowires Investigated by Scanned Probe Microscopy" Nanoletters (2002) 2(5):447-450.

* cited by examiner

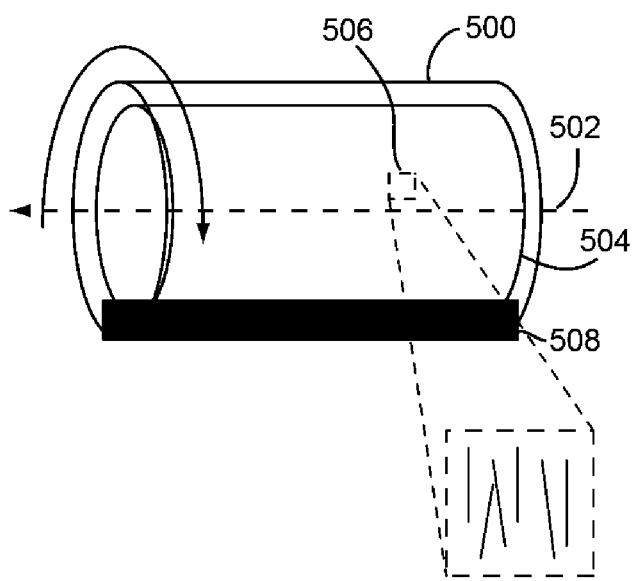
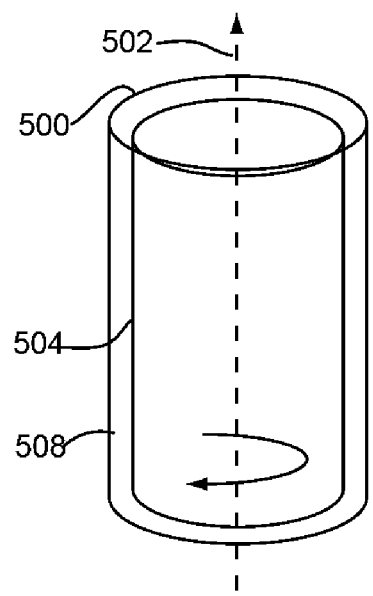
FIG. 5A                    FIG. 5B

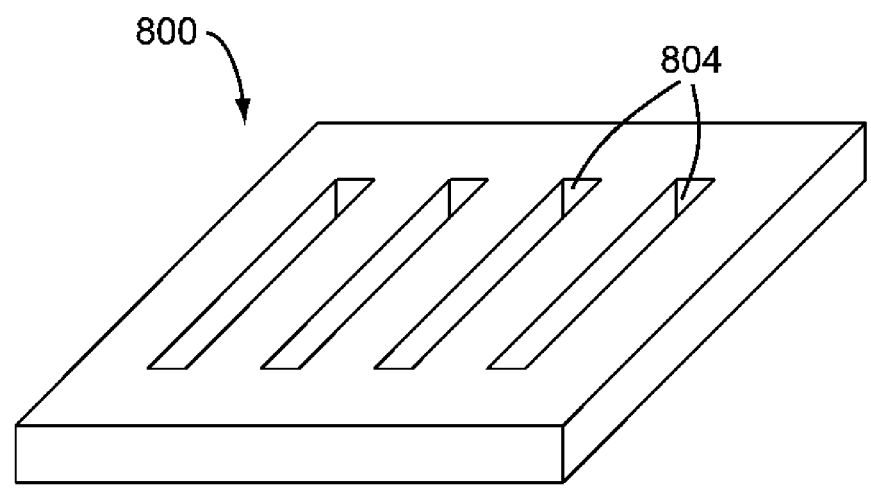
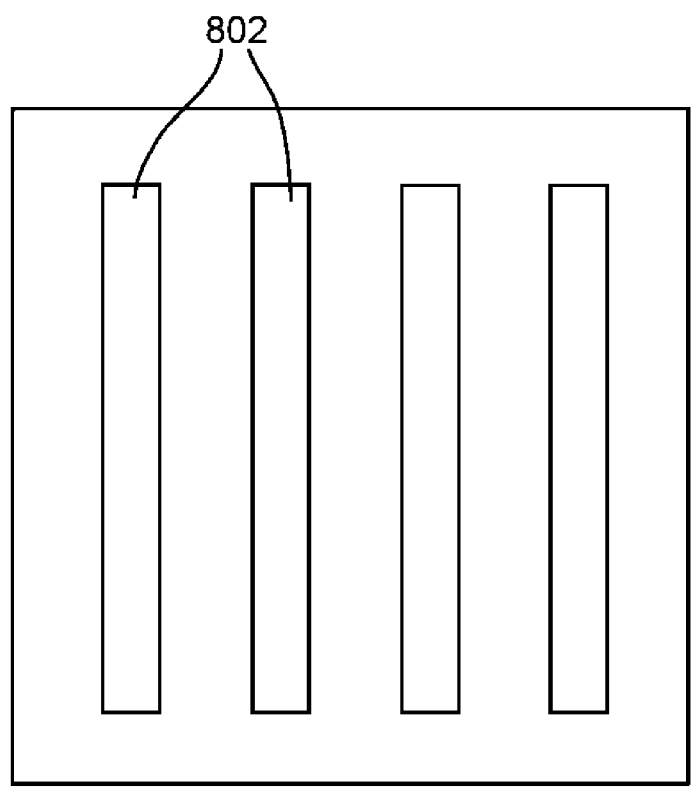
FIG. 8

SYSTEMS AND METHODS FOR HARVESTING AND INTEGRATING NANOWIRES

CROSS REFERENCE TO RELATED APPLICATIONS

The present application is a divisional of U.S. patent application Ser. No. 11/117,707, filed Apr. 29, 2005, which claims the benefit of the filing dates of U.S. Provisional Patent Application No. 60/586,170, filed Jul. 7, 2004, U.S. Provisional Patent Application No. 60/605,454, filed Aug. 30, 2004 and U.S. Provisional Patent Application No. 60/653,574, filed Feb. 16, 2005, the disclosures of which applications are incorporated by reference herein in their entireties.

BACKGROUND OF THE INVENTION

1. Field of the Invention

The present invention relates to nanowires, and more particularly, to nanowire harvesting and integration.

2. Background of the Invention

Nanomaterials, and in particular, nanowires have the potential to facilitate a whole new generation of electronic devices. For example, In certain cases, uses of nanomaterials have been proposed that exploit the unique and interesting properties of these materials more as a bulk material than as individual elements requiring individual assembly. For example, Duan et al., Nature 425:274-278 (September 2003), describes a nanowire based transistor for use in large area electronic substrates, such as, displays, antennas, and the like that employ a bulk processed, oriented semiconductor nanowire film or layer in place of a rigid semiconductor wafer. The result is an electronic substrate that performs on par with a single crystal wafer substrate that can be manufactured using conventional and less expensive processes than those used to manufacture poorer performing amorphous semiconductors, which is also more amenable to varied architectures, such as, flexible and/or shaped materials.

In another example, bulk processed nanocrystals have been described for use as a flexible and efficient active layer for photoelectric devices. In particular, the ability to provide a quantum confined semiconductor crystal in a hole conducting matrix (to provide a type-II bandgap offset), allows the production of a photoactive layer that can be exploited either as a photovoltaic device or photoelectric detector. When disposed in an active composite, these nanomaterials are simply processed using standard film coating processes. See, e.g., U.S. Pat. No. 6,878,871, which is incorporated herein by reference in its entirety.

In accordance with these uses of nanowires and other nanomaterials, the new process requirement is the ability to provide a film of nanowires that are substantially oriented along a given axis. The technology for such orientation has already been described in detail in, for example, International Publication Nos. WO 03/085700, WO 03/085701 and WO 2004/032191, as well as U.S. Pat. No. 7,067,328, which all are incorporated herein by reference in their entirety.

A major impediment to the emergence of this new generation of electronic devices based on nanostructures is the ability to effectively grow nanowires and other nanostructures that have consistent characteristics. Current approaches to harvest and integrate nanowires do not facilitate mass production, do not yield consistent nanowire performance characteristics and can be improved to generate better device performance based on nanowires.

What are needed are systems and methods for nanowire harvesting and integration that facilitate mass production, yield consistent nanowire performance characteristics and generate improved device performance.

SUMMARY OF THE INVENTION

The present invention provides methods for harvesting and integrating nanowires that facilitate mass production, yield consistent nanowire performance characteristics and generate improved device performance in devices based on nanowires.

In a first aspect of the invention, a method is provided for harvesting nanowires. The method includes providing a first substrate having a first sacrificial layer deposited thereon, the first sacrificial layer being selectively dissolvable relative to a first semiconductor material, growing a population of nanowires on the first sacrificial layer, the nanowires comprising the first semiconductor material, and selectively dissolving the sacrificial layer without dissolving the nanowires, to release the population of nanowires from the first substrate.

In another aspect, the invention provides a method of harvesting nanowires, including providing a population of semiconductor nanowires attached to a surface of a growth substrate, exposing the population of nanowires to an etchant to remove a sacrificial layer from the population of nanowires; and harvesting the population of nanowires from the growth substrate. The sacrificial layer may comprise, for example, an oxide layer, silicon nitride layer, a layer of photoresist and the like deposited on the substrate.

In another aspect of the invention, a method is provided for depositing nanowires onto a first surface in a substantially aligned orientation. This method includes providing the first surface as an outer surface of a cylinder, placing a portion of the outer surface of the cylinder into contact with a fluid suspension of nanowires, and rolling the cylinder to advance different portions of the first surface into and out of the fluid suspension of nanowires.

In a related aspect of the invention, a method for coating nanowires onto a first surface of a substrate in a substantially aligned orientation is disclosed. This method includes providing an applicator roller having an outer surface and an axis, rotating the applicator roller about its axis to place at least a portion of the outer surface of the roller into contact with a fluid suspension of nanowires, and translating the first surface of the substrate relative to the rotating applicator roller to coat the first surface of the substrate with the fluid suspension of nanowires.

The applicator roller can be a part of a standard direct or reverse gravure coater, for example, or any other suitable coater known to those of ordinary skill in the art. The applicator roller can be configured to rotate in the same or an opposite direction to the direction of movement of the substrate. The relative motion between the applicator roller and the surface of the substrate helps to transfer a consistent amount of nanowire coating material from the roller to the substrate to coat the substrate with substantially aligned nanowires. The coating material may consist of nanowires in an appropriate solvent, or there may be additional stabilizers, binders, surfactants etc., which can be used to create a suitable nanowire coating. Metering of the nanowire coating solution can be accomplished by the gravure roller in a conventional manner.

In a further aspect, the invention provides a method of depositing nanowires onto a first surface of a substrate that includes providing a plurality of substantially aligned (or unaligned) nanowires immobilized within an aperture disposed through a substrate. Next a second substrate is placed adjacent to the first surface of the first substrate, and a force is applied to the nanowires disposed within the aperture to transfer the nanowires to the first surface of the first substrate in a substantially aligned fashion.

In an additional aspect, the invention provides a method of preventing gate shorts in a nanowire based transistor that includes providing at least a population of nanowires, wherein a subset of the population of nanowires spans a source and drain electrode, the population of nanowire comprising a semiconductor core region extending a length of the nanowire, and a dielectric shell region extending a length of the nanowire, providing ohmic contact between the source and drain electrodes and any of the population of nanowires in contact therewith, differentially etching away the core region of the nanowire population that is not in ohmic contact with the source or drain electrode; and providing a gate electrode over the population of nanowires, whereby the gate electrode is not in ohmic contact with the core region of the population of nanowires.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

FIG. 5A illustrates a drum based system for orienting films of nanowires onto substrates in which the drum is positioned horizontally.

FIG. 5B a diagram of a drum based system for orienting films of nanowires onto substrates in which the drum is positioned vertically.

FIG. 8 is a diagram of a slotted or apertured substrate used in the oriented growth of nanowires for subsequent application.

DETAILED DESCRIPTION OF THE INVENTION

Figure 1A:
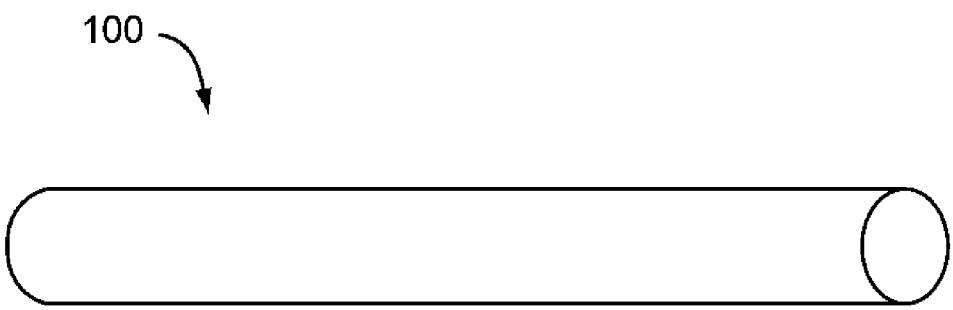
FIG. 1A is a diagram of a single crystal semiconductor nanowire.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably greater than 50, and more preferably, greater than 100.

The nanowires of this invention can be substantially homogeneous in material properties, or in certain embodiments can be heterogeneous (e.g. nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P(BP$_6$), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN$_2$, CaCN$_2$, ZnGeP$_2$, CdSnAs$_2$, ZnSnSb$_2$, CuGeP$_3$, CuSi$_2$P$_3$, (Cu, Ag)(Al, Ga, In, Tl, Fe)(S, Se, Te)$_2$, Si$_3$N$_4$, Ge$_3$N$_4$, Al$_2$O$_3$, (Al, Ga, In)$_2$ (S, Se, Te)$_3$, Al$_2$CO, and an appropriate combination of two or more such semiconductors.

The nanowires can also be formed from other materials such as metals such as gold, nickel, palladium, iradium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom", etc.) made herein are for purposes of illustration only, and that devices of the present invention can be spatially arranged in any orientation or manner.

Nanomaterials have been produced in a wide variety of different ways. For example, solution based, surfactant mediated crystal growth has been described for producing spherical inorganic nanomaterials, e.g., quantum dots, as well as elongated nanomaterials, e.g., nanorods and nanotetrapods. Other methods have also been employed to produce nanomaterials, including vapor phase methods. For example, silicon nanocrystals have been reported produced by laser pyrolysis of silane gas.

Other methods employ substrate based synthesis methods including, e.g., low temperature synthesis methods for producing, e.g., ZnO nanowires as described by Greene et al.

("Low-temperature wafer scale production of ZnO nanowire arrays", L. Greene, M. Law, J. Goldberger, F. Kim, J. Johnson, Y. Zhang, R. Saykally, P. Yang, Angew. *Chem. Int. Ed.* 42, 3031-3034, 2003), and higher temperature VLS methods that employ catalytic gold particles, e.g., that are deposited either as a colloid or as a thin film that forms a particle upon heating. Such VLS methods of producing nanowires are described in, for example, Published International Patent Application No. WO 02/017362, the full disclosure of which is incorporated herein by reference in its entirety for all purposes.

Types of Nanowires and their Synthesis

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
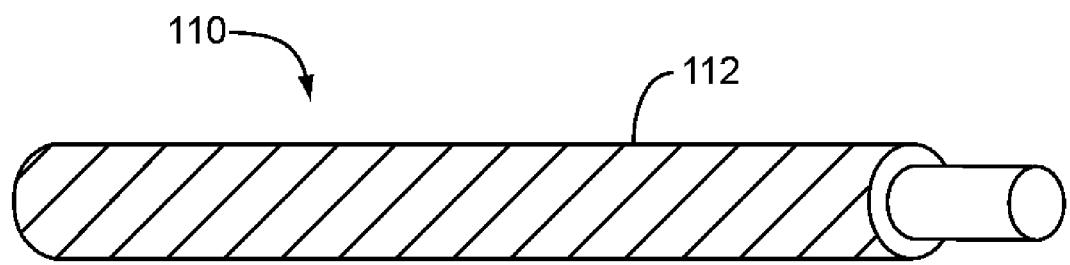
FIG. 1B is a diagram of a nanowire doped according to a core-shell structure.

FIG. 1B shows a nanowire 110 doped according to a core-shell structure. As shown in FIG. 1B, nanowire 110 has a doped surface layer 112, which can have varying thickness levels, including being only a molecular monolayer on the surface of nanowire 110.

The valence band of the insulating shell can be lower than the valence band of the core for p-type doped wires, or the conduction band of the shell can be higher than the core for n-type doped wires. Generally, the core nanostructure can be made from any metallic or semiconductor material, and the shell can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the shell can comprise a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105, 4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "*Synthesis of Soluble and Processable Rod-, Arrow-, Teardrop-, and Tetrapod-Shaped CdSe Nanocrystals*" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413, 489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019-7029; Dabbousi et al.

(1997) "(CdSe)ZnS core-shell quantum dots: Synthesis and characterization of a size series of highly luminescent nanocrysallites" *J. Phys. Chem. B* 101, 9463-9475; Manna et al. (2002) "*Epitaxial growth and photochemical annealing of graded CdS/ZnS shells on colloidal CdSe nanorods*" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application 60/370,095 (Apr. 2, 2002) to Empedocles entitled "Nanowire heterostructures for encoding information." Similar approaches can be applied to growth of other heterostructures.

Exemplary Nanowire Devices

Figure 2A:
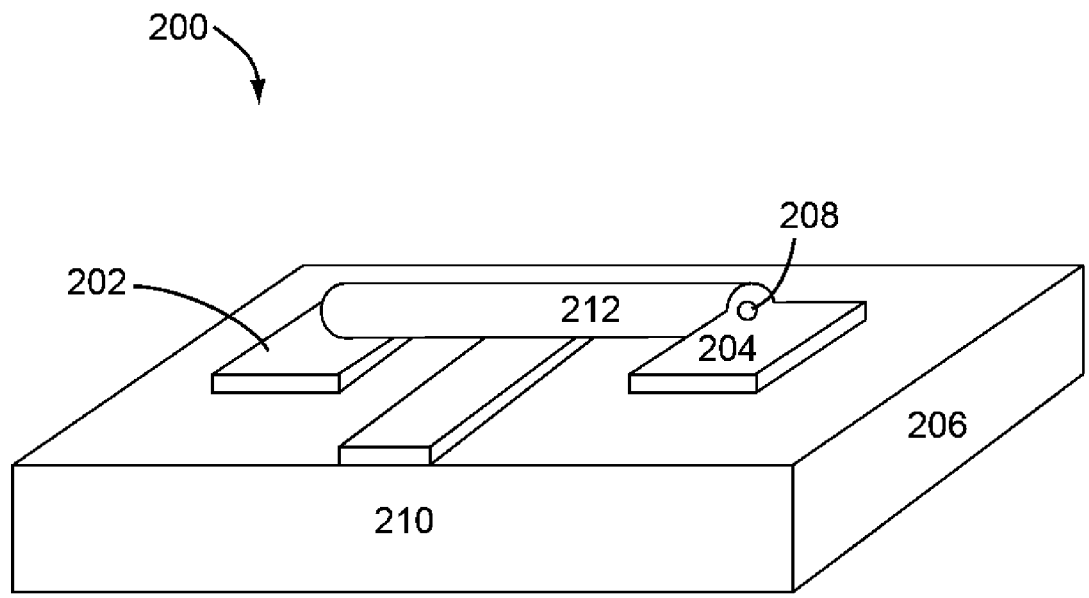
FIG. 2A is a diagram of a nanowire based transistor device.

Exemplary applications of semiconductor nanowire materials include simple electronic components, such as, transistors. For example, a simple nanowire transistor device is shown in FIG. 2A. As shown, the basic device 200 includes a source electrode 202 and a drain electrode 204 disposed upon a substrate 206 and spaced apart from each other. A semiconductor nanowire 208 is provided spanning the two electrodes and is electrically connected to the electrodes 202 and 204. The transistor typically includes an insulator or dielectric layer over its surface that provides insulation between the nanowire 208 and, for example, gate electrode 210. As shown, the dielectric layer is provided as an oxide shell 212 or coating on the nanowire 208. By modulating the field applied to the gate electrode 210, one can vary the conductivity of the nanowire 208 as in a conventional field effect transistor (FET).

Figure 2B:
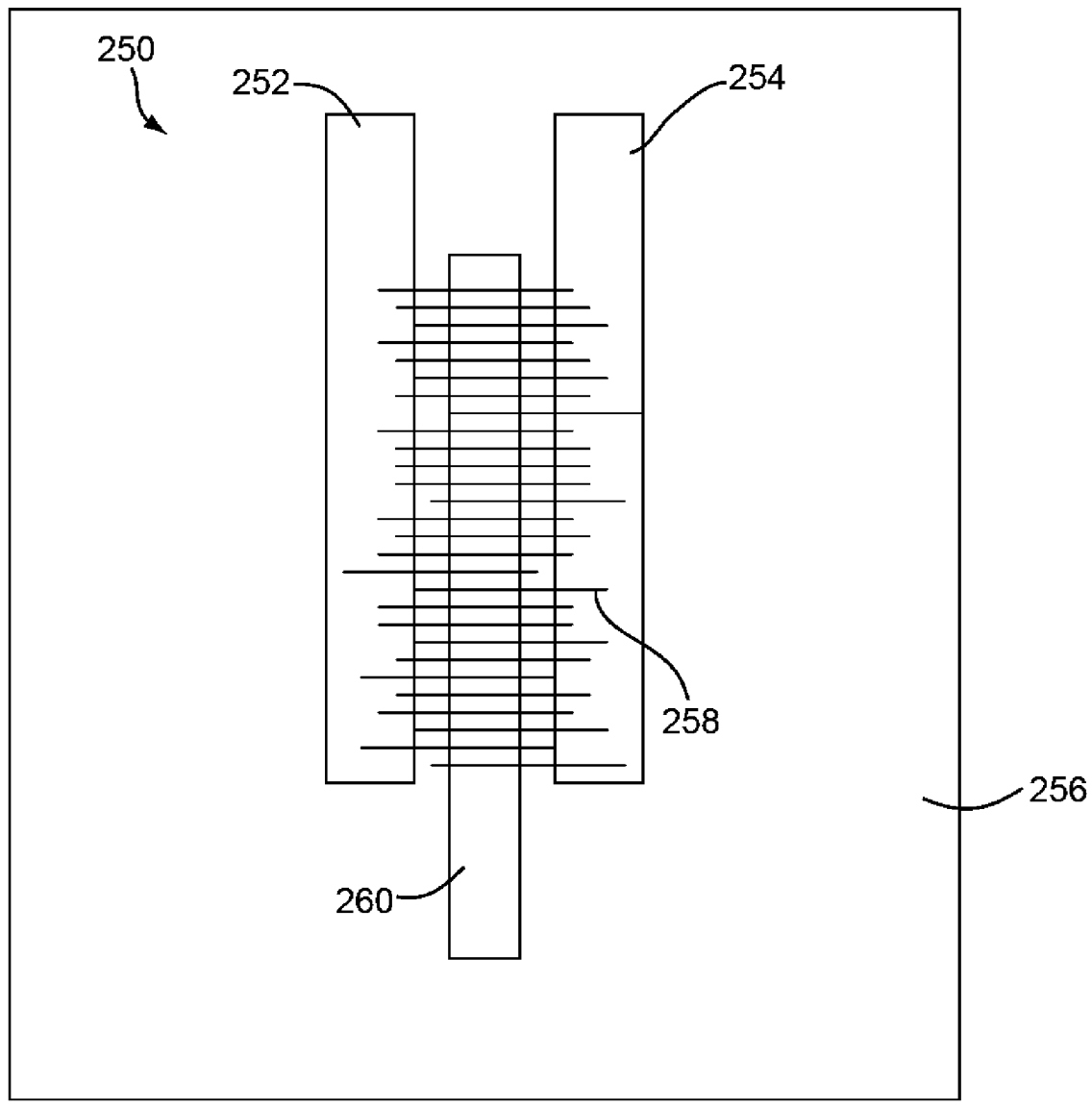
FIG. 2B is a diagram of a nanowire based transistor device having a film of oriented nanowires employed as the conductive channel.

FIG. 2B schematically illustrates a variation of the simple device shown in FIG. 2A. As shown, the transistor device 250 includes source 252, drain 254 and gate 260 electrode provided upon a substrate 256. However, in place of a single nanowire with a dielectric shell is a film or population of substantially oriented nanowires 258 that span the source and drain electrodes 252 and 254, bridging the gate electrode 260. As compared to the device illustrated in FIG. 2A, the nanowire film 258 provides a much higher current density than a single nanowire based device, while retaining processibility advantages of film-based processing and uniformity. In particular, the fact that some of the nanowires in the nanowire population do not completely span the source and drain electrodes does not substantively affect the operation of the device as the overwhelming number of nanowires will provide this functionality.

Sacrificial Layers and Other Methods for Harvesting Nanowires

Once synthesized, for many applications, it is necessary to separate the nanowires from the substrate from which they are grown. For example, in certain nanowire applications, it is desirable to provide nanowires deposited as a thin film of wires over a flat substrate surface (See, e.g., Published International Patent Application No. 2004/032193, and Duan et al., Nature 425:274-278 (September 2003)). Accordingly, it is desirable to be able to uniformly remove nanowires from the growth substrate, e.g., without randomly breaking the wires upon removal. In this respect, the invention provides methods of incorporating a release layer in the growth substrate, that can be activated to release the wires from the surface uniformly and without any extraneous mechanical disruption that may cause uneven breakage or the like.

In a particular aspect, a sacrificial layer is deposited upon or other wise provided upon the growth substrate. By sacrificial layer, is meant a layer that can be selectively removed or altered to allow facile removal of the nanowires that are attached thereto without the need for mechanical removal methods, for example, scraping, shearing or the like. By way of example, a sacrificial layer may include a layer that is selectively etchable without damaging the wires attached to it.

For example, where silicon nanowires are grown, the underlying substrate may be provided with, e.g., a silicon nitride layer. The silicon nitride layer may be selectively etched using, e.g., orthophosphoric acid, which etches the nitride layer without attacking the silicon nanowires. Depending upon the composition of the synthesized wires, a variety of different sacrificial layers may be employed, provided they can be differentially treated to release the wires without damaging them. Such materials include, for example, oxide layers, metal layers, or the like, which may react differently to various etchants or other chemicals than semiconductor wires, for example, silicon.

Some exemplary wire/release layer pairs include, for example, Si nanowires grown from an $SiO_2$ substrate having a tungsten or molybdemum sacrificial layer over the $SiO_2$ substrate. This metal layer can generally be differentially etched using buffered, mildly alkaline ferricyannide-based etchant formulations that are generally commercially available. Likewise, SiN layers may be used between a SiO2 substrate and Si nanowires. Such sacrificial layers may generally be etched using phosphoric acid, e.g., 85% by weight. The sacrificial layer may be crystalline (and/or templated on a crystalline substrate) to generate templated vertical nanowire growth. For example, atomic layer deposition (ALD) may be used to deposit a thin film of a catalyst material over a sapphire substrate, where the thin film retains the crystal periodicity of the sapphire, but is differentially etchable compared to sapphire and the nanowires.

In other embodiments of the invention for uniformly removing nanowires from the growth substrate, for example, without randomly breaking the wires upon removal, there are disclosed methods for releasing nanowires at their base, for example, by selectively etching the base portion of the nanowires. In this respect, the invention provides methods of selectively exposing the base portion of the nanowires, and chemically (or mechanically, ultrasonically, etc.) releasing (e.g., by etching) the base portion to remove the wires from the surface uniformly and without any extraneous mechanical disruption that may cause uneven breakage or the like.

Figure 3:
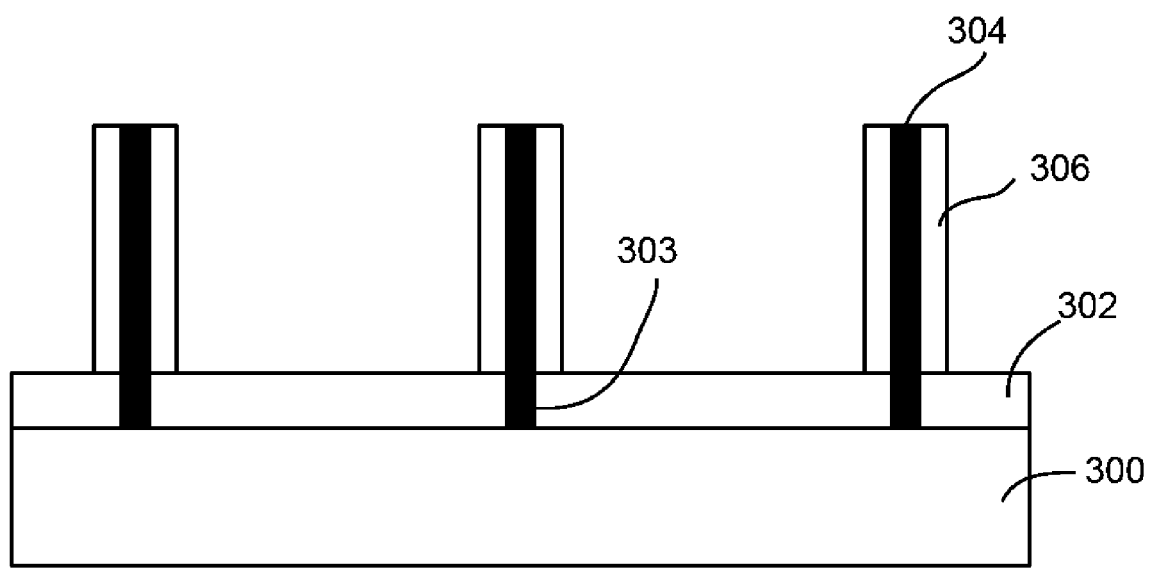
FIG. 3 schematically illustrates a process for harvesting nanowires from a growth substrate using a combination of photoresist materials.

For example, with reference first to FIG. 3, a first embodiment is shown in which a commonly used photoresist material 302 is first deposited (e.g., spin coated) on the substrate (e.g., a Si substrate) to coat the end portions 303 of the nanowires 304 proximate a surface of the substrate 300. Any excess photoresist inadvertently deposited on the sidewalls of the nanowires can be removed using, for example, one or more commercially available photoresist solvents or chemicals and/or dry oxygen plasma etching.

A second layer of a different photoresist material 306, which can be differentially etched from the first photoresist material 302, may then be patterned on the sidewalls of the nanowires. The surface of the nanowires may optionally be functionalized, for example, with standard silane chemistries or other chemical moieties to attract the second photoresist material 306 (e.g., a hydrophobic polymer such as polyvinylidene fluoride (PVDF)) that would adhere to the nanowires, and not the photoresist 302 on the substrate.

The photoresist 302 on the substrate may then be removed with standard chemicals or solvents and/or by plasma etching to expose the end portions 303 of the nanowires.

The exposed end portions of the nanowires attached to the substrate may then be etched with an etchant such as $HF/HNO_3$, for example, for silicon nanowires, to release and remove the nanowires resulting in freestanding nanowires of substantially uniform length.

The nanowires can be removed as grown (e.g., without an oxide and/or metal shell coating), or can be removed after a post-growth oxidation (or other process step) to form one or more shell layers (e.g., a dielectric or metal gate layer) on the nanowire core (as described further below). In the latter case, a separate HF etch or metal etch step may also be required to completely remove one or more of the shell layers such as a dielectric or conductive metal (e.g., gate) layer.

The photoresists used in this process are relatively easy to coat and easy to dissolve. The process is compatible with most of the materials and processes used in existing microfabrication technology, such as doping the wires directly on the growth substrate prior to release and deposition on a device substrate.

In another embodiment for releasing nanowires from the growth substrate is shown in FIGS. 4A-D, a process flow is shown for growing and releasing core-shell nanowire structures from a growth substrate 401. This process flow involves multi-layer core-shell nanowires containing, for example, a semiconducting core chosen to provide the desired electronic functionality (e.g., CMOS compatibility, RF signal processing capabilities, light emission, etc.), a gate-dielectric innershell and a gate-electrode conductive outer-shell.

The first shell is an insulating dielectric layer that acts as the gate-dielectric in the final device. When employed, the outer layer is a conductive layer that acts as a conformal gate electrode around each individual wire in the final device. Such multi-layer (and single) core-shell nanowires are further described, for example, in co-pending U.S. Pat. No. 7,051,945, the entire contents of which are incorporated by reference herein.

In this embodiment, following growth of core nanowires 400 (e.g., using VLS epitaxial growth to grow core Si nanowires, for example, by decomposing SiCl4 at around 900 degrees C. in a CVD furnace on a <111> Si wafer properly coated with Au or Pt colloids or thin film patterns), the nanowires are exposed to an etchant (e.g., HF vapor) to remove the native (amorphous) oxide layer. Removal of the native oxide layer is performed if the thin native oxide layer is not of sufficient quality to withstand a high electric field used in device applications such as macroelectronic applications.

The native oxide layer can be replaced with a high quality dielectric material layer 402 (e.g., a silicon oxide shell) generated by either controlled thermal oxidation or chemical vapor deposition, for example. Dielectric material layer 402 can be chosen from a variety of dielectric materials, such as $SiO_2$ or $Si_3N_4$. The dielectric material layer 402 can be formed by oxidizing the nanowire, coating the nanowire, or otherwise forming the dielectric layer. Other non-oxided high dielectric constant materials can be used, including silicon nitride, $Ta_2O_5$, $TiO_2$, $ZrO_2$, $HfO_2$, $Al_2O_3$, and others. Nitridation of nanowires can be accomplished with processes similar to those employed in oxidation of nanowires. These materials can be applied to nanowires by chemical vapor deposition (CVD), solution phase over-coating, or simply by spin-coating the appropriate precursor onto the substrate. Other known techniques can also be employed, as would be apparent to persons of skill in the relevant arts.

Figure 4A:
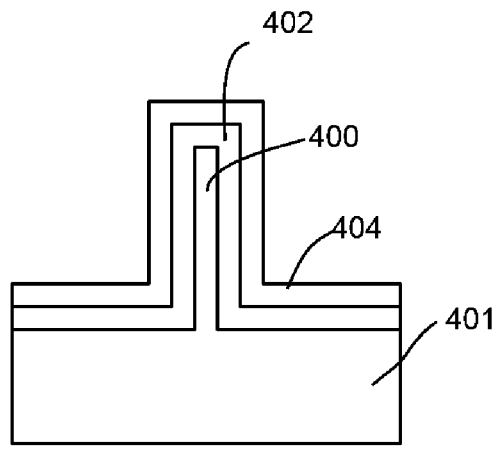
FIGS. 4A-D schematically illustrate a process for harvesting nanowires (e.g., core-shell nanowire structures) from a growth substrate.

Next, as shown in FIG. 4A, a gate electrode outer shell layer 404 of a conductive material such as WN, W, Pt, highly doped silicon etc., which is preferably able to withstand high processing temperatures (e.g., on the order of about 1000 degrees C.), is deposited on the inner dielectric material layer 402, for example, by atomic layer deposition (ALD) or other conformal deposition process. The outer shell layer 404 is a conductive layer that acts as a conformal gate electrode around each individual wire in the final device.

Figure 4B:
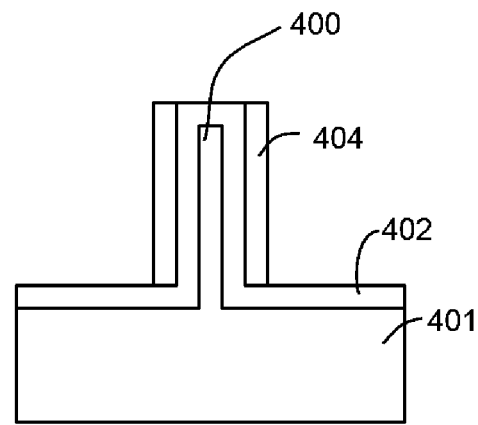

This deposition step is followed by a directional etch step to etch portions of the outer shell layer 404 overlaying the substrate 401 as shown in FIG. 4B. This can be accomplished, for example, by using physical etching such as ion mill etching or reverse-sputtering, or by chemical etching with appropriate wet chemical etchants such as phosphoric, hydrochloric, nitric, and/or acetic acids or others known to those of ordinary skill in the art. Subsequently, the substrate is exposed to a buffered oxide etch (BOE) vapor or wet solution for approximately between about 10 seconds to 60 seconds, or for example, between about 10 seconds to 30 seconds, to remove the exposed oxide layer 402 from the substrate surface and from the exposed end portions on the nanowires as shown in FIG. 4C.

Figure 4C:
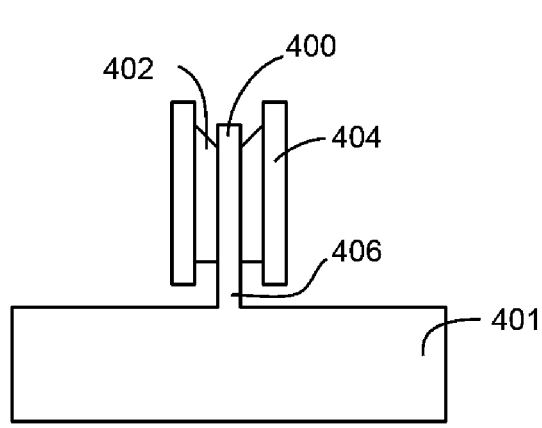

The exposed base portion 406 of the nanowire 400 may then be etched, for example, by dipping the growth substrate into a wet Si etch bath, or by suitable BOE etch (e.g., following selective oxidization after removal of the dielectric layer from the growth substrate and the exposed end portions of the nanowires in FIG. 4C).

Figure 4D:
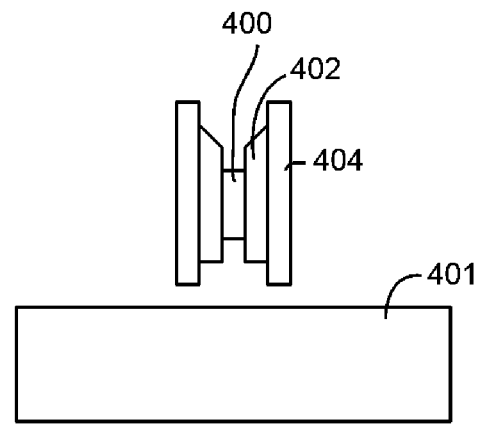

The Si acid bath has the advantage of etching the Si core wire inside the shell layers 402, 404 as shown in FIG. 4D which can help prevent shorts to deposited metals or to the outer conductive shell layer 404 when the nanowires are incorporated into device structures such as FET's, diodes and the like. Etching the exposed end portions of the nanowires releases them from the growth substrate as shown in FIG. 4D. The growth substrate may then be removed from the acid bath, or the acid bath neutralized with suitable alkali chemicals to stop the etching process. The removed nanowires may then be dispersed in solution and made available for deposition/coating onto a suitable device substrate as described further below.

It is to be appreciated that the above described process can be applied to other nanowire materials and other core-shell structures as well, including simpler single core-shell structures as well as three layer, four layer, and additional multi-layer core-shell structures. The doping and doping type of the core-shell structure can be flexibly changed and controlled during the growth process as well to obtain desired properties.

Integration of Nanowires into Devices

Following synthesis and release of nanowires from growth substrates, many applications require the controlled deposition of the free nanowires onto another substrate, for example, upon an electronic substrate, connecting electrical contacts, etc. For example, in certain cases, it is desirable to provide films of nanowires deposited upon a substrate and positioned in particular locations and/or oriented substantially along a one or more particular axes. A number of methods have been previously described for depositing and aligning or orienting nanowires on a substrate, including flow based alignment where fluids carrying nanowires are flowed over the substrate. Alternatively methods that utilize adhesive patches to stick and stretch the nanowires into a desired orientation have also been described. In accordance with the present invention, a modification to a typical flow based alignment method, for example, as described in U.S. Pat. No. 6,872,645, which is incorporated herein by reference, is envisioned.

In particular, previously described flow-based orientation methods applied a channel or other fluid conduit over the desired portion of the substrate upon which oriented wires were to be deposited. The surface was typically treated with a chemical moiety that facilitated wire adhesion or association. When flowed through the channel, the wires tend to align along the streamlines of the flowing fluid, thus orienting in the direction of flow. While very effective, this type of orientation method required the use of fluid channel blocks, etc., and was better suited for small scale.

The present invention, however, employs a process that is much better suited to larger scale production of oriented nanowire films or substrates. In a particular embodiment, a fluid suspension of nanowires is deposited into a rolling drum. Typically, the drum is oriented sideways, so as to permit a much smaller volume of fluid to be used, but still allow uniform coating of a portion of the drum or the entire drum. A substrate, for example, flexible substrate, is then wrapped around a smaller inner drum which is disposed within the larger drum, so that a portion of the substrate's surface is in contact with the fluid suspension of wires. The drum is then turned so that the suspension flows over the surface of the substrate. This flowing provides the same level of orientation as previously described methods, but does so over a larger substrate area of a flexible material. Although illustrated with a flexible substrate, it will be appreciated that small rigid substrates may be used as well, provided their surfaces are in contact with the fluid in the rolling drum at some point during the rotation.

In alternative arrangements, the drums may be oriented in an upright orientation, with the fluid suspension sandwiched between the substrate and the outer wall of the larger drum. Both exemplary configurations are illustrated in FIGS. 5A and 5B. As shown in FIG. 5A, a main drum 500 is provided on a horizontal axis or axle 502 so as to permit rotation. A small drum 504 is inserted into the larger drum 500. In some cases, the smaller drum 504 may be fixedly coupled to the same axle 502 as the larger drum 500, or actually joined to the larger drum 500, so that both drums rotate together. However, as noted previously, in certain cases, it is desirable to permit independent rotation of the two drums. As such, the inner drum 504 may be coupled to a separate axle or may simply be independent from and on separate bearings from the larger drum 500, so that it can rotate freely. The substrate 506 is placed on the outer surface of inner drum 504 inside larger drum 500.

A small amount of a fluid nanowire suspension 508 is provided in the larger drum, in sufficient amount to allow contact of the substrate 506 with the fluid 508.

FIG. 5B illustrates a similar embodiment, but where the inner and outer drums 500 and 504 are placed upon a vertically oriented axle 502. In this case, it may be desirable to provide a smaller amount of space between the two drums, so as to minimize the amount of fluid used.

Following rotation through the fluid suspension of nanowires 508, the wires in solution will be deposited upon the surface of the substrate 506 in a substantially oriented fashion, as a result of the flow based contact, as shown in the expanded view segment of substrate 506. Flow based methods of nanowire alignment and orientation on substrates are described in U.S. Pat. No. 6,872,645, previously incorporated herein by reference.

Figure 6A:
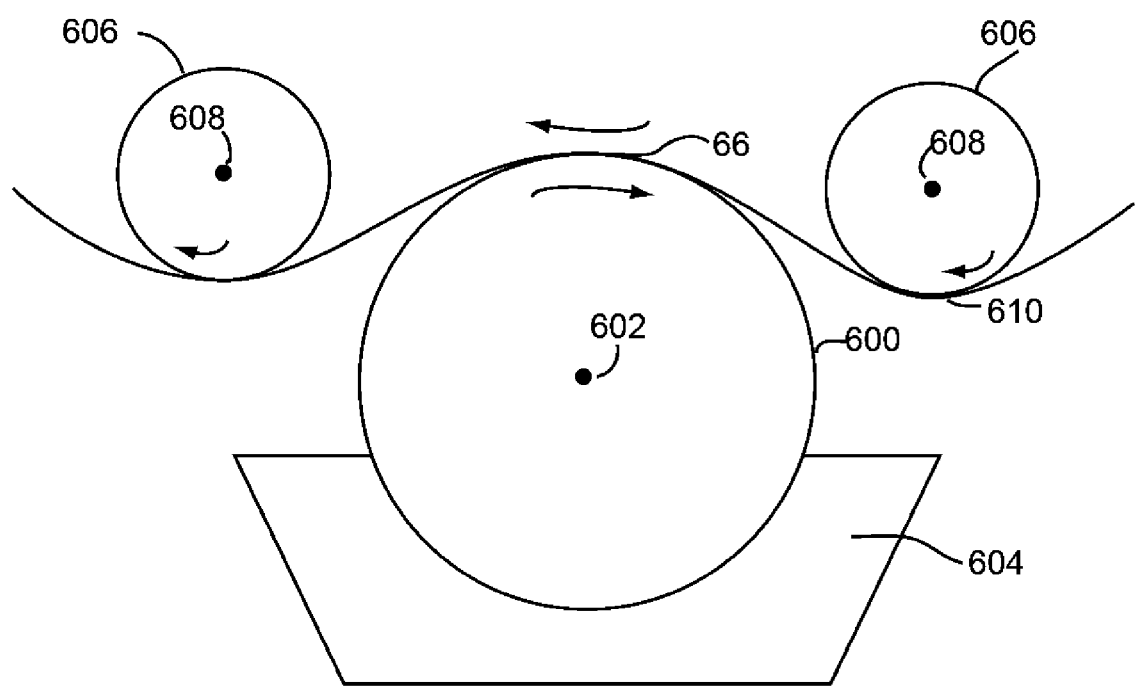
FIG. 6A is a diagram of a reverse gravure coater that can be used to deposit and align nanowires on a surface of a substrate, e.g., for integration into a functional device.

In a related aspect of the invention, a gravure coater as shown in FIG. 6A can be used to facilitate large scale production of oriented nanowire films on substrates. In this embodiment, a main applicator roller or drum 600 is provided on a horizontal axis or axle 602 so as to permit rotation through a solution of nanowires 604. Second impression rollers or drums 606 are located on opposite sides of main roller 600 and are configured to rotate in either in the same or opposite direction as main roller 600 on horizontal axes or axles 608. The substrate 610 to be coated passes around the impression rollers 606, and is coated by the nanowire solution in a nip 612 formed between roller 600 and substrate 610.

Figure 6B:
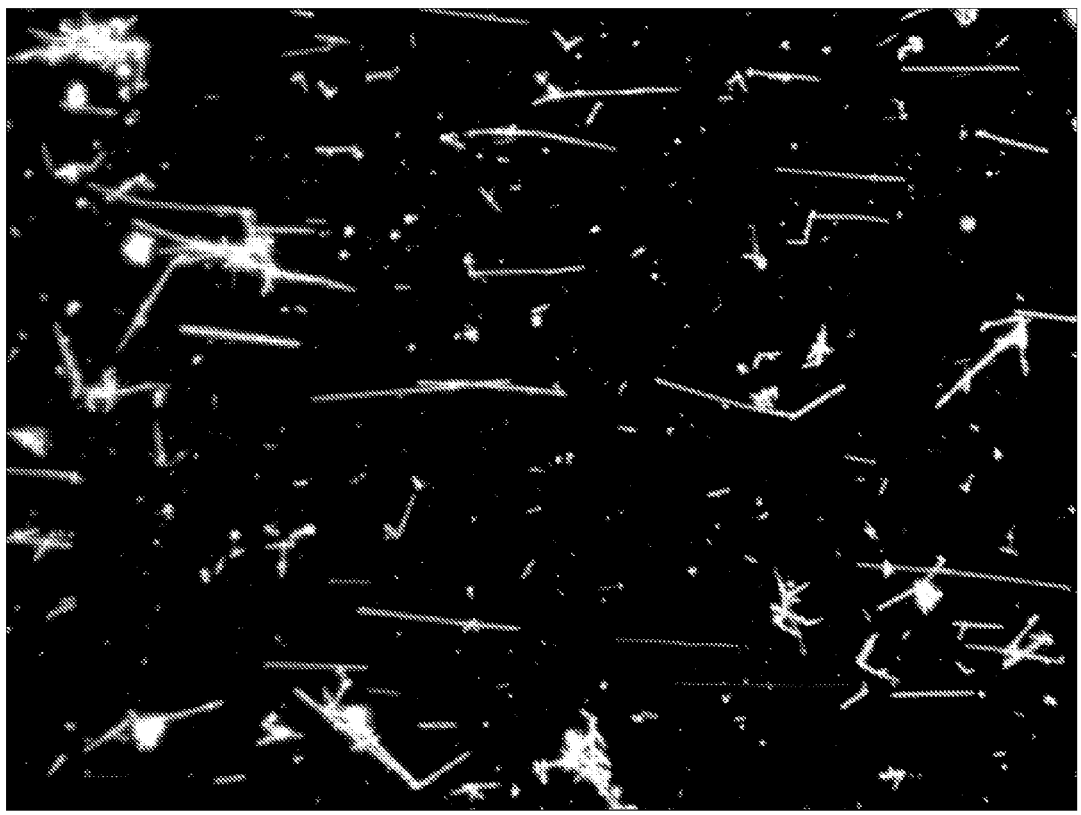
FIG. 6B is an SEM image showing a population of nanowires which have been substantially aligned on a surface of a substrate using a reverse gravure coater as shown in FIG. 6A.

Following rotation of the main applicator roller 600 through the fluid suspension of nanowires 604, the wires in solution will be deposited upon the surface of the substrate 610 in a substantially oriented fashion as shown by reference to FIG. 6B, as a result of the flow based contact and shearing motion between the substrate and gravure roller surfaces. The relative motion helps to transfer a consistent amount of nanowire coating material from the gravure applicator roller 600 to the substrate 610 to coat the substrate with substantially aligned nanowires.

The coating material may consist of nanowires in an appropriate solvent, or there may be additional stabilizers, binders, surfactants etc. which can be used to create a suitable nanowire coating. Metering of the nanowire coating solution can be accomplished by the gravure roller in a conventional manner.

It is to be appreciated that other types of coaters other than direct or reverse gravure coaters can be used for applying roll coatings of nanowires to a surface of a substrate including without limitation rod coaters, differential offset gravure coaters, micro gravure coaters, reverse roll coaters, 3-roll coaters, saturation coaters, hot melt coaters, split film coaters, knife coaters, dip coaters, slot die coaters, slide coaters, doctor blade coaters, Meyer rod and Meyer rod related coaters, and other roll coaters which are well know to those of ordinary skill in the art. A variety of coating processes may also be used such as, for example, hot melt coating, pressure sensitive coating, PVC resin, doctor blade hand drawdown or Meyer rod coating, and other coating techniques or machines by which a liquid flow can be generated during the coating to achieve proper nanowire alignment.

In macroelectronic and other applications, electronic components may be sparsely arrayed over select portions of a substrate surface. For example, co-pending and commonly assigned U.S. Pat. No. 7,067,867 describes methods and systems for high-performance large-area thin-film electronics that provide the electronic performance of a silicon wafer, but can be processed over large areas, at low-temperature, on flexible plastic substrates. The substrates described therein incorporate thin films of semiconducting nanowires deposited therein and configured to operate as transistors (or other electronic devices such as diodes and the like). In such applications, nanowires are only needed at certain locations where the semiconductor devices (e.g., transistors, diodes etc.) are to be formed. Nanowires used for fabrication of these electronic components can be uniformly deposited on the surface of the substrate, but any nanowires not actually incorporated into the electronic devices are "wasted." It is possible that these extraneous wires could be removed and recycled to reduce cost, but a more direct cost savings could be realized with a patterned deposition process, in which the extraneous nanowires are not deposited at all.

Figure 7A:
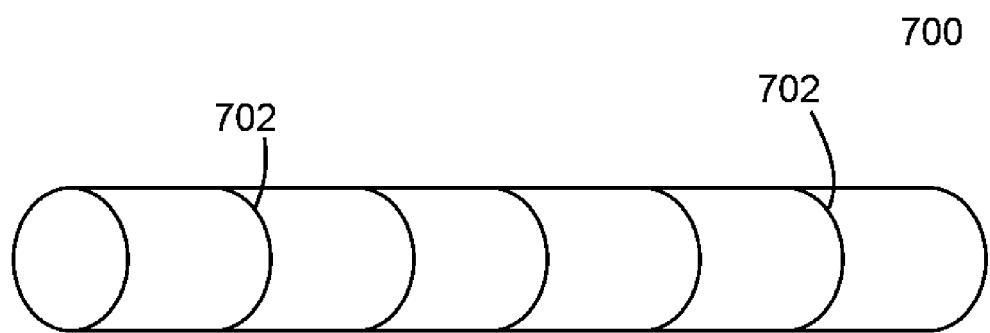
FIG. 7A is a diagram of a gravure coater that includes a "striped" pattern in which a thin film of nanowires is patterned in a series of stripes on the coater that are aligned in the direction of web motion of the coater.
Figure 7B:
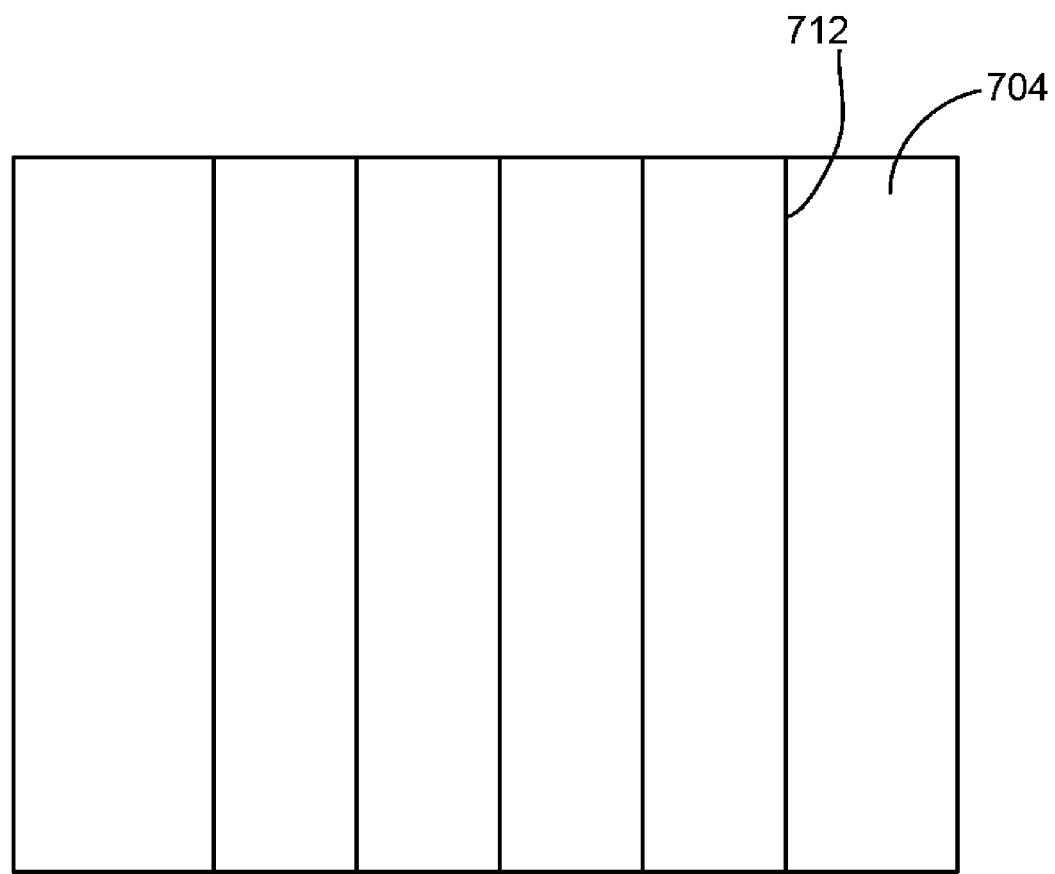
FIG. 7B is a diagram of a substrate (e.g., a flexible, plastic substrate) that has been coated using the striped gravure coater of FIG. 7A.

In web-based (e.g., roll-to-roll) processing applications, a thin film of nanowires can be patterned on a device substrate, for example, by using a gravure coater 700 having a "striped" pattern in which a film of nanowires is patterned in a series of stripes 702 that are aligned in the direction of web motion as shown in FIGS. 7A and 7B. The use of such a striped gravure coater 700 provides a striped pattern of nanowires 712, corresponding to series of stripes 702, on a device substrate 704 used in a nanowire-based device, as shown in FIG. 7B. The savings in nanowires is governed by the stripe pitch and width, for example, a stripe width of 100 microns with a pitch of 1 mm may allow a 75% to 90% (or more) reduction in nanowire usage.

Striping with a web coater such as a gravure coater can be realized in a number of ways to provide alternating smooth and textured regions (e.g., corresponding to non-deposition and deposition regions, respectively) to deposit aligned nanowires in stripes where they are needed. If a gravure coater (e.g., a direct or reverse gravure coater as described above) is used, which has the advantage of aligning the nanowires, the striping can be accomplished by, for example, texturing only the part of the gravure roller 700 where stripes are to be located, or by lyophobic treatment of the gravure roller in the area between stripes. With slot coating, the slot can be closed between the stripes. Alternatively, the nanowire deposition can be uniform, but striping occurs with a patterned doctor-blade or Meyer rod down-web of the deposition.

Furthermore, according to other aspects of the present invention, nanowires can be deposited from solution in specific, patterned locations on large area substrates using low-cost, low-temperature processes including micro-contact, offset or ink-jet printing technology, for example. In one embodiment, for example, ink-jet printing technology can be used to both pattern nanowires on a substrate surface and to further deposit a metallic ink which forms electrode structures around isolated areas of deposited nanowires. The metallic ink electrodes can be used, for example, to electrostatically align the nanowires on the surface of the substrate.

To do so, an ink-jet printer can be used to print two materials on the substrate surface: a nanowire containing "ink" or film that is patterned onto the substrate at specific locations where nanowires are desired, and a conductive metallic ink that will form electrodes proximate to or in contact with isolated areas of deposited nanowires. The substrate onto which the nanowires are printed may be flexible or rigid, and can be in the form of a web or sheet (e.g., for roll-to-roll processing applications) or any other suitable substrate structure. Preferably, the printed nanowire solution comprises a water-immiscible, hydrophobic liquid containing suspended nanowires and the conductive liquid may comprise water (or other solution) which includes ions, conductive polymers etc. to render it conductive, or other hydrophilic conductive liquid.

Alternatively, the nanowire ink could be an acqueous solution, and the metallic ink could be a hydrophobic liquid. In any event, the nanowire and conductive inks are preferentially mutually immiscible so that there is no appreciable mixing or diffusion of one into the other. The conductive liquid can be deposited in a pattern such that an electric field can be created across each deposited nanowire inked area. An electrical potential between two or more electrodes can then be applied to substantially align the nanowires on the substrate surface. Adhesion promoters like APTES ((3-Aminopropyl) triethoxysilane) or deprotectable adhesion promoters may be employed to enhance deposition and/or association of nanowires with the substrate surface, or other chemical moieties or binders may be used to secure the nanowires in place. If desired, the electrodes may be removed by rinsing or evaporation and the patterned, aligned nanowires are then ready for further processing.

In other embodiments, offset lithography can be used to pattern nanowires onto a surface using a similar process as described above. For example, nanowires suspended in a hydrophobic (or hydrophilic) ink may be applied to a substrate surface that has been pre-patterned with hydrophobic and hydrophilic areas. The nanowire solution wets the hydrophilic (or hydrophobic) regions, and then the plate is coated with a hydrophilic (or hydrophobic) conductive metallic ink (or water) which coats the un-wetted areas. Again, an electric field applied across conductive ink areas can be used to align the nanowires on the substrate surface.

Alternatively, alignment of the nanowires may be accomplished using water (or other conductive medium such as silicone rubber) as the "electrodes" as long as there is adequate isolation between wetted areas to form electrode pairs across which an electric field may be applied. Advantageously, where the nanowires are applied/patterned as stripes on the substrate surface as described above, for example, the stripes inherently isolate the water electrodes from each other to allow an electric field to be applied between striped areas of nanowires to align them on the surface. The water may then be evaporated from the surface, leaving aligned, patterned nanowires which are available for further processing.

Also provided herein is an alternative method for the deposition of pre-oriented nanowires on a receiving substrate. In particular, the invention provides for the oriented growth of nanowires in apertures disposed through a growth substrate, followed by the extrusion or "punching" of the oriented nanowires onto a receiving substrate using, for example, a punching or typing mechanism.

As noted, the methods of the invention employ a nanowire carrying substrate that provides a population of oriented nanowires disposed in a matrix that is, in turn, disposed within an aperture that is disposed through the substrate. The substrate aperture is placed adjacent to a receiving substrate, for example, an electronic substrate where it is desired to fabricate nanowire based devices, and a punch or stamp is applied to the opposing side of the matrix, through the aperture to affix the oriented nanowire film onto the receiving substrate. To the extent necessary, subsequent processing may be used to remove any of the matrix material that remains on the oriented nanowires on the receiving substrate.

Particularly novel aspects of this portion of the invention relate not only to the stamping method of transferring oriented nanowires from the first substrate to the receiving substrate, but also to the methods of providing oriented nanowires in the apertures of the first substrate. In particular, by growing nanowires on the opposing interior walls of elongated apertures or slots disposed through the growth substrate, one can provide a population of nanowires that is substantially oriented and/or aligned across the width of the aperture.

Figure 9:
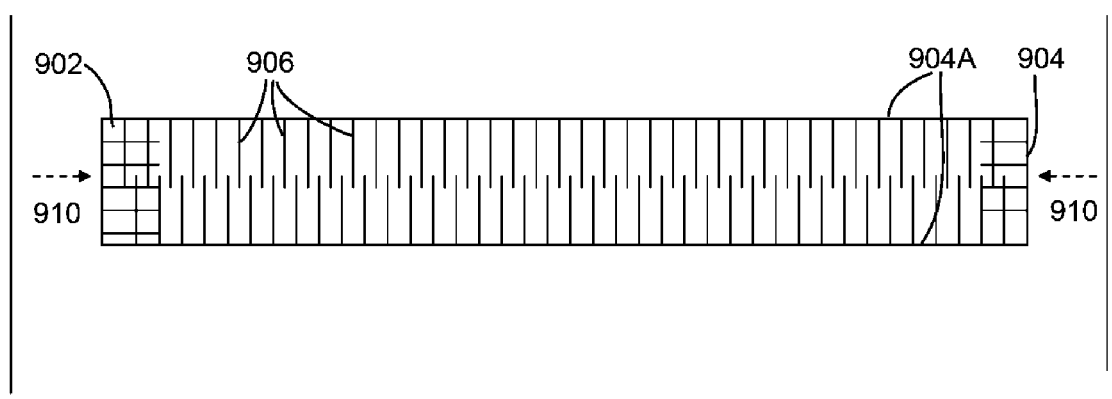
FIG. 9 is a diagram of an aperture on a substrate as shown in FIG. 8 that includes substantially oriented nanowires spanning the aperture by having been grown across the aperture.
Figure 10:
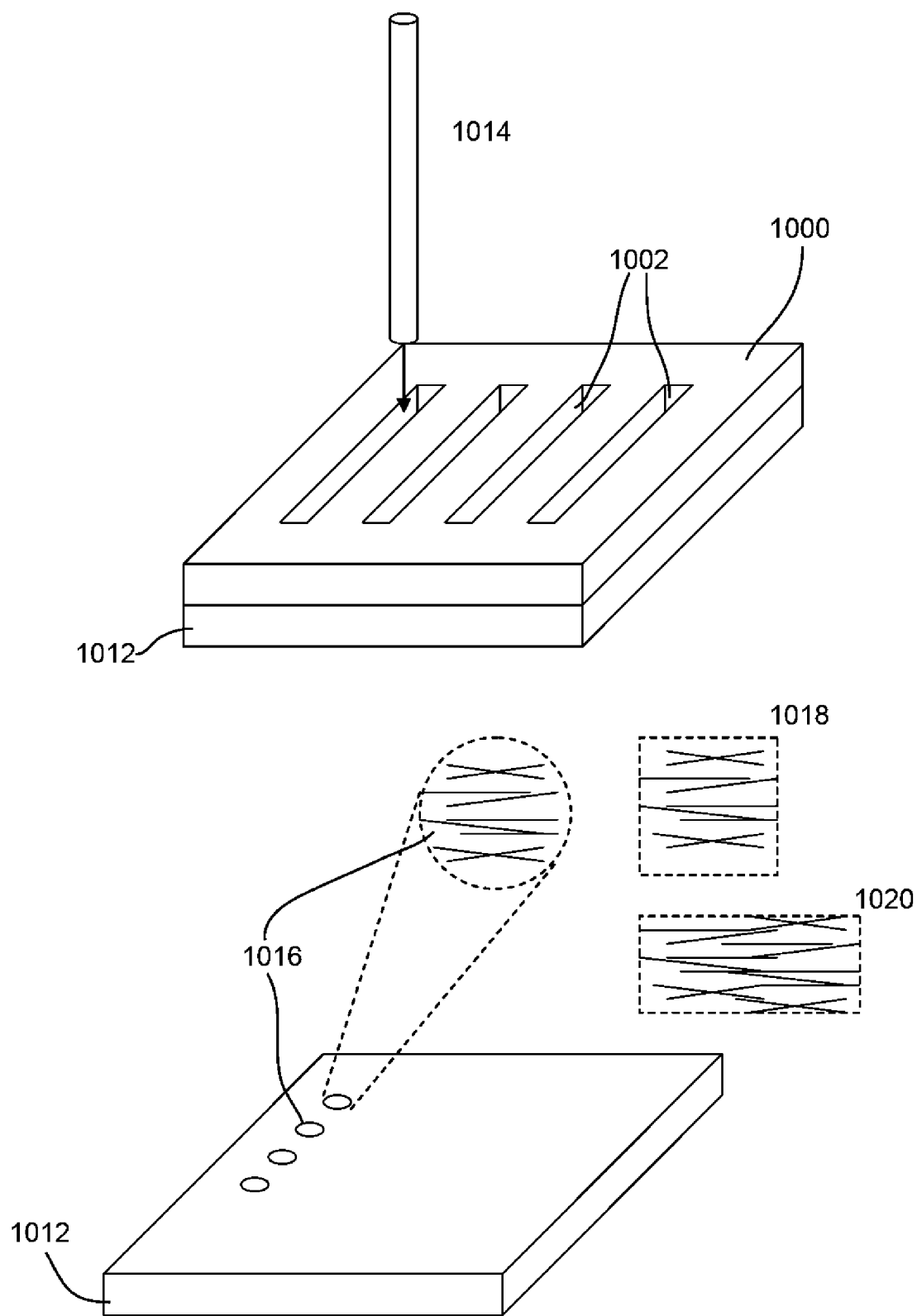
FIG. 10 schematically shows a system and process for transferring substantially oriented nanowires from an apertured growth substrate to a receiving substrate, for example, for integration into a functional device.

The overall process of this aspect of the invention is schematically illustrated in FIGS. 8-10. In accordance with the present invention, and as shown in FIG. 8, a first substrate 800 is provided having one or more apertures 802 disposed through it. In preferred aspects, and as shown, the apertures 802 are provided as elongated openings or slots disposed through the first substrate 800, so as to maximize the amount of interior wall surface area 804 in the apertures that is oriented parallel to a given axis, for example, the major axis of elongated apertures 802.

As shown in FIG. 9, a population of nanowires 906 is provided on at least the interior wall surfaces 904 of the aperture 902. Interior wall surface 904 runs parallel to axis 910, which extends along the length of aperture 902 (see dashed line in FIG. 9). Interior wall surface 904A runs perpendicular to axis 910 at each end of aperture 902. As shown, the population of nanowires typically extends in a direction normal to the plane of the interior wall surfaces 904 and 904A. Because the apertures are elongated, the majority of the interior wall space is oriented parallel to one axis, while the majority of nanowires extending from those wall spaces are oriented across or normal to that axis.

Providing the population of nanowires in an orientation that extends from the interior wall surfaces typically involves the in situ growth of the nanowires on those surfaces. In particular, nanowires are grown using a catalyst driven VLS process, where gold colloids (or thin gold films) are deposited onto the surface upon which wire growth is desired. In the case of gold colloids, using a high temperature VLS process, the gold colloids form a eutectic with the gas phase semiconductor precursor for the nanowire and initiate crystal formation that corresponds with the diameter of the gold colloid. In the case of thin gold films, the high temperature process typically causes the melting and coalescence of the gold film into discrete droplets, which, in turn, form a eutectic with the gas phase semiconductor, and initiate crystal formation (and wire growth).

Wire growth may be preferentially provided on those interior walls, or it may be uniformly provided over the entire surface of the growth substrate. In order to preferentially provide the catalyst on the interior wall portions, one may apply an adhesion promoter, for example, as described elsewhere herein, only to the interior portions. Alternatively, one may simply contact a suspension of catalyst particles only with the interior wall portions, e.g., through the use of a fluidic manifold that directs the suspension only through the apertures. Alternatively, one may coat the entire substrate, and then selectively remove the catalyst that is not within the apertures. This selective removal may be accomplished mechanically, e.g., through scraping, or it may be performed lithographically, for example, by filling the apertures with a resist and chemically or through use of an appropriate solvent, removing the catalysts that remain exposed. As will be noted, a photoresist might be used to coat all surfaces of the substrate, followed by photolithographic removal of the resist on the other surfaces of the growth substrate.

Once the growth substrate is produced having the substantially oriented nanowires within an aperture, for example, as shown in FIG. 9, it may be further processed to remove any nanowires or other debris from other parts of its surface. For example, where wire growth was not limited to the interior walls of the aperture, it may be desirable to remove wires from other surfaces of the substrate.

In order to facilitate transfer of oriented nanowires from the growth substrate to the receiving substrate in a coherent fashion, for example, with less breaking or separation, it may be desirable to encase the nanowires within the aperture in a film or other composite matrix. For example, one may introduce a polymeric material into the aperture to surround and encase the nanowires within the aperture. A wide variety of polymer materials may be employed, including preferably, resists, like photoresists which may provide processing benefits as well. For example, by encasing the nanowires in a photoresist, one can readily remove resist from all other surfaces by developing the resist elsewhere on the substrate, by photo-exposing those other regions. A wide variety of different positive and negative photoresists may be obtained commercially.

In addition to permitting selective further processing of other portions of the substrate, the resist also functions to encapsulate the nanowires within the aperture for the transfer process, for example, transferring the wires form the growth substrate to the receiving substrate. A schematic of the process used to affect this transfer is shown in FIG. 10. As shown, the growth substrate 1000 having the nanowires immobilized within apertures 1002, for example, in a polymer matrix or otherwise attached to the interior wall surfaces of the substrate, is provided adjacent to and mated with receiving substrate 1012. A stamp or punch 1014 is then brought into contact with the wire matrix such that an amount of pressure is applied to separate the nanowires from the substrate 1002, as well as separate a portion of the overall matrix from the remainder of the matrix, if any. This effectively punches a quantity of the wire containing matrix from the aperture 1004, onto the receiving substrate 1012, which yields a population of oriented nanowires on the receiving substrate, shown in the expanded view as wire population 1016.

The punch or stamp may be configured with a variety of different shapes to conform to the desired end application. For example, it may provide a circular tip to punch circular patterns of oriented nanowires onto the receiving substrate. Alternatively, it may be rectangular, square or other polygonal shape depending upon the ultimate application. The configuration of the tip of the punch may also be varied to provide optimal transfer of material from the growth substrate to the receiving substrate. For example, the tip may have a cupped conformation to provide optimal pressure around the edges of the stamped film of nanowires, without damaging the internally included nanowires. Those of skill in the art in film transfer techniques will recognize that a number of conventional variations may be practiced upon this basic transfer method.

Typically, in ensuring that contact between nanowires and a substrate results in actual deposition, for example, adhesion, coupling or other semi-fixed association, there are a number of methods for adhering nanowires to a substrate surface, including dry methods where wires are pressed against an adhesive surface on the substrate. In the case of flow based deposition, a chemical binding moiety is typically employed to ensure that nanowires that contact the substrate surface have an opportunity to adhere to that surface. Examples of such chemical moieties include, for example, highly charged compounds, such as polylysine, polyarginine or the like, which associate both with solid substrates, e.g., glass or silicon, as well as semiconductor nanowires of, for example, silicon.

In mechanical deposition methods, for example, non-flow based deposition, like shear based or scrape placement deposition of wires, in at least one particular embodiment, adhesion promoters like APTES ((3-Aminopropyl) triethoxysilane) may be employed to enhance deposition and/or association of nanowires with a substrate surface. Other adhesion promoters include, for example, polylysine, polyarginine or other highly charged molecules.

In some cases, deprotectable adhesion promoters may be employed to allow for patterned deprotection, and thus localization of nanowires, using, for example, photodeprotectable groups on the chemistry, that are known in the art. Examples of such deprotectable groups include, ortho nitropiperonyl (or veratryl) oxycarbonyl groups, including NPOC, NVOC, MeNPOC, and MeNVOC, which are described in U.S. Pat. No. 6,310,189. In addition to using an adhesion promoter, for example, APTES, one may also enhance the association efficiency of the nanowires in solution with the treated substrate surface by providing the nanowires in an appropriately polar solvent, in order to drive the nanowires onto the treated substrate.

By way of example, silicon nanowires disposed in a relatively polar solvent, that is, ethylene glycol or other alcohols, or the like, will show a greater affinity for, for example, an APTES treated silicon surface. The result will be a higher density nanowire film deposited upon the substrate surface.

Nanowires deposited on the surface of substrates, for example, in accordance with the above-described methods, have uses in a variety of applications in electronic and other applications. In a number of applications, however, some compositional issues may cause difficulties in the ultimate utility of the ultimate device. In particular, in at least one particularly valuable application, nanowires are deposited as a population of oriented nanowires, for example, in a film, over an electrical substrate. The wires will substantially span source and drain electrodes in typical electrical devices, for example, transistors, diodes, etc.

A schematic illustration of a typical nanowire film based transistor was described above with reference to FIG. 2A. As shown, a population of nanowires 208 is provided spanning source and drain electrodes 202 and 204, respectively, with a gate electrode provided across a portion of the channel region of nanowires 208, of the nanowire population that affects the conductivity of the channel through depletion or accumulation. The transistor device includes a dielectric layer between the conductive channel portion of the population of nanowires and the gate electrode, to prevent shorting between the gate and the channel. One advantage of the use of nanowires as the conductive channel of the device is the ability to incorporate the dielectric layer directly on the nanowires during synthesis.

In at least one aspect, the conformal insulator layer is provided following wire synthesis while the nanowires are still attached to their growth substrate, for example, prior to removal and/or deposition onto a receiving substrate. While a variety of conventional oxidation processes or deposition processes like atomic layer deposition may be employed in building an insulating layer for example, thermal oxidation, ambient oxidation, and the like, in particularly preferred processes, rapid thermal oxidation is used to generate the oxide layer. Rapid thermal oxidation ("RTO") typically employs higher temperatures for much shorter periods than conventional thermal oxidation.

Typically, in accordance with the present invention, prior to a RTO process, any native oxide present on the nanowires on their growth substrate or on the ultimate device, are removed. This is typically accomplished by performing a brief etch step, for example, exposing the nanowires to hydrofluoric acid (HF) for a period long enough to remove the native oxide layer, as well as any surface defects or contamination. While immersion based etching to remove the native oxide can be used, it has been seen that far better device performance results when the native oxide is removed using a vapor based etching step, e.g., using HF vapor or plasma etching. Without being bound to a particular theory, it is believed that immersion based etching of the nanowire substrate causes the nanowires upon the substrate to clump, flatten or otherwise group in a way that prevents production of high density nanowire films on the receiving substrate.

Following the etching step, the nanowires are rapidly thermally oxidized by placing the nanowire bearing wafers into a RTO chamber which typically ramps the temperature of the chamber up to about 500° C. in a $N_2$ atmosphere. The oxidation step is used to provide an insulator layer over the core conducting wire that provides the dielectric layer between the wire and any subsequently provided gate electrode or gate electrode layer. In the RTO chamber, the temperature is then elevated rapidly, e.g., 100° C./sec, to the desired temperature, e.g., >850° C. (typically between 900 and 1100° C.) in $O_2$, and allowed to sit in $O_2$ saturated atmosphere for several minutes. The temperature is then brought back down to ambient temperatures in $N_2$. Typically, at temperatures between 900 and 1100° C. for 1 to 5 minutes yields oxide layers of from about 50 to about 100 angstroms. Similar processes may be employed to provide a nitride or oxynitride shell on the core nanowire, using different reactive gases in addition to $O_2$, including, e.g., $NH_3$, $N_2O$ or NO.

Alternatively, nitridation can be done over the oxide layer, e.g., by introducing such gases into the RTO chamber after oxidation. Likewise, RTO processes can be combined with alternating etch steps in a "grow-etch-grow" process, in order to provide a relatively defect free interface between the core nanowire and its surrounding oxide layer, by removing surface contamination and defects in the silicon nanowire (see, e.g., U.S. Pat. No. 6,380,103). While the etching step may be performed within the RTO chamber, it is generally less desirable as it may impact oxide formation steps. Typically, and as described elsewhere herein, a vapor etch step is performed before oxide formation.

The usefulness of the thin film or oriented nanowire film application of nanowires relies, in part, upon the ability to bulk process the nanowires onto the substrates, without being especially mindful of the positioning of the nanowires thereon. As a result, while a substantial number of nanowires will span source and drain electrodes, in some cases, individual nanowires may only contact one electrode or the other, and in still other cases, may only span between the gate region and the source or drain. The potential electrical connection or shorting between source or drain and gate electrodes provides a substantial problem in manufacturing high performance electronic devices.

By way of example, because nanowires are often synthesized using metal catalysts, the residual metal at one end of the nanowire may provide a current path that may cause shorting, for example, gate shorts in FETs, or the like. Similarly, open ends of oxide coated nanowires may provide a short path for a nanowire based device. Accordingly, in many cases, it is desirable to further process deposited nanowires on the substrate to remove any potential current paths other than through the nanowire itself, for example, which may cause gate shorting.

In general, the present invention provides for the covering of any potential conductive short path. In the cases of metal catalytic particles still attached to nanowires, this also typically entails removal of the metal before covering the resultant exposed conductive path.

Accordingly, metallic portions of nanowires, for example, gold ends, can be differentially and selectively removed from the nanowires by differentially etching them away. For example, in the case of silicon nanowires having gold tips, the tips may be etched using $KI_2$ or bromine prior to any oxidation steps. This selectively etches away the gold tips without etching the underlying semiconductor nanowire. Other types of metal catalysts may be selectively removed using similar techniques, as will be appreciated by those of skill in the art.

Once a metal portion is removed exposing the underlying semiconductor, or in the case of a semiconductor that is exposed due to breakage during harvesting or deposition, the semiconductor portion needs to be covered or insulated in order to avoid providing a potential short route. Oxidation and/or nitridation are typically employed in covering exposed semiconductor, as the oxide coating is an effective insulator and also generates from the underlying surface, e.g., SiO from a Si wire. Accordingly, after removal of a metal portion of a nanowire, the nanowires deposited upon a substrate are subject to oxidation and/or nitridation using known techniques, e.g., ambient oxidation, thermal or plasma oxidation. By way of example, it is expected that nitridation of open ends of nanowires, followed by oxidation, will result in relatively small amount of radial growth of the shell oxide as compared to growth of the end cap oxide. A dopant anneal step is then optionally applied to ensure complete insulation of the previously exposed region.

Alternate methods may also be employed to prevent shorting between nanowire ends and the gate electrodes in addition to or in place of oxidation where some wires in a population do not completely span the gate electrode to bridge the source and drain, for example, they terminate under the gate electrode. For example, in some cases, after formation of an oxide coating on a nanowire that terminates at a region that is over or will be covered by a gate electrode (and potentially shorting to that electrode through the uncovered end) one can isotropically and selectively etch any exposed core wire to provide a recessed end, and thus avoid direct electrical contact between the gate electrode and the conductive core of the nanowire component. Example etchants include KOH, TMAH or XeF2. Additionally, the catalyst etch and silicon core etch can be combined if an etchant that etches both materials is used.

Figure 11A:
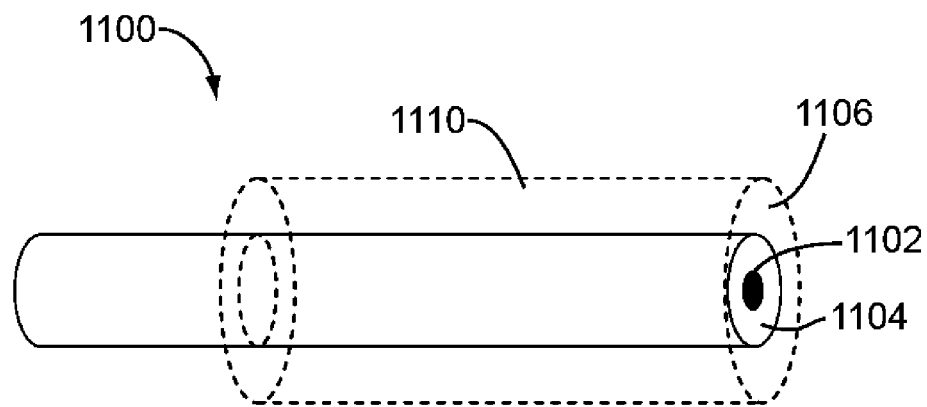
FIGS. 11A-11C schematically illustrate processes for preventing gate shorts in nanowire based transistor devices through the further processing of nanowires and nanowire films.
Figure 11B:
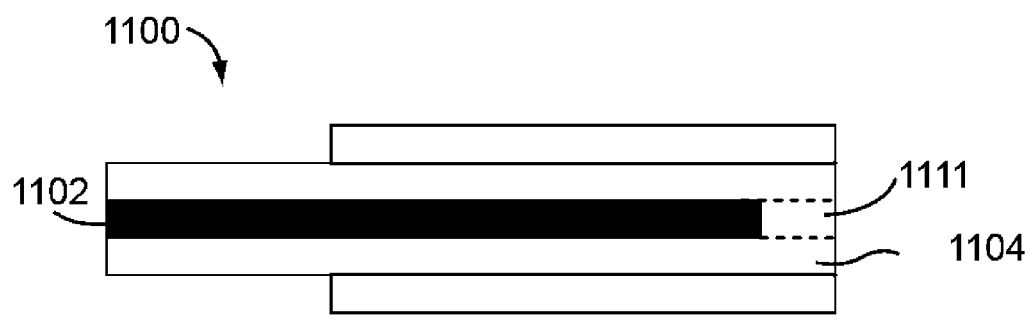

This aspect of the invention is illustrated in FIGS. 11A and 11B, which shows a nanowire 1100 that includes a semiconductor core 1102 and an oxide shell 1104. As shown, end 1106 is not capped with an oxide layer, and thus potentially provides an electrical short to a conformal gate electrode 1110. In accordance with the instant aspect of the present invention, however, an isotropic etching step is applied to the nanowires deposited on the substrate prior to deposition of a conforming electrode 1110. By applying this etch step, the core 1102 is provided recessed within the outer oxide shell 1104 (as shown in FIG. 11B). As a result, a conformal gate electrode 1110 is unlikely to short to the core 1102 of nanowire 1100 as shown at etched region 1111. This selective etch step can also be used to prevent gate oxide shorts to nanowires that have a defective oxide layer. For example, it has been found that by selectively etching nanowires in the region of the gate electrode, that one can isotropically and selectively etch away the core wire at the location of a defective oxide region. Thereby direct electrical contact between the gate electrode and the conductive core of the nanowire through the defective oxide layer can be avoided.

Interestingly, it has also been found that the use of a dry etchant such as $XeF_2$ can substantially remove the silicon core from shorter nanowires (e.g., nanowires having a length of less than about 3 to 5 microns, for example) without structurally damaging longer nanowires (e.g., nanowires with a length greater than about 5 microns) that are useful for devices. Thus, for example, nanowires that are less than about 80% of the average length of the wires in a given nanowire population, for example, less than about 50% of the average length of the wires in a given nanowire population, for example, less than about 20% of the average length of the wires in the nanowire population, for example, less than about 10% of the average length of the wires in the nanowire population, can be removed to improve overall performance. The dry etching also removes unwanted silicon particles that can contaminate the device substrate. In this way, for example, some shorter nanowires in a thin film population of wires deposited on a device substrate that are not electrically coupled to the metal contacts such as the gate electrode and/or the source and drain contacts can be faciley removed without damaging other, longer wires. Additionally, etching the silicon core of such unwanted, smaller nanowires can eliminate the capacitance associated with their presence and thereby improve device performance.

Figure 11C:
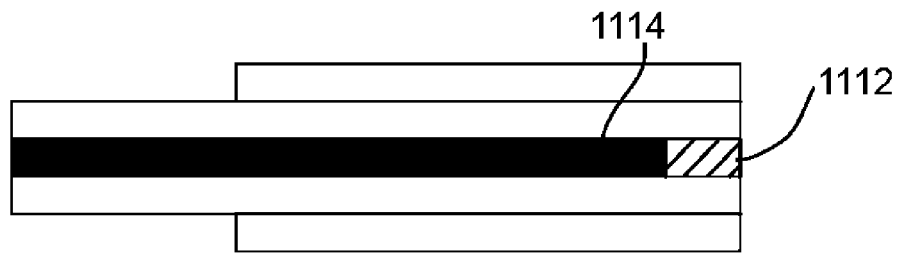

Alternatively, nanowires deposited upon a substrate (and having an oxide layer) may be subject to doping that is opposite to that of the core nanowire, to provide an effective insulator at the exposed ends of the core nanowire, preventing shorting of the core to a gate electrode. This aspect of the invention is schematically illustrated in FIG. 11C. As shown, a core shell nanowire 1100 is provided upon a substrate, and terminating at a point that would be covered by or would cover a gate electrode. A conformal gate electrode 1110 is applied over the nanowire 1100. In accordance with the instant aspect of the present invention, however, end region 1112 is doped oppositely to the remainder of the core nanowire region 1114. This opposite doping prevents conduction through wire end 1112, which would result in shorting. Different compositional elements that are provided to avoid shorting or other problems may be incorporated into the nanowires either during synthesis or following deposition upon a substrate. For example, in some cases, doped end regions may be doped during wire synthesis. Further, by incorporating a sacrificial layer beneath the wires, for example, as described elsewhere herein, or by incorporating a release portion of a wire during growth, one can position such regions relatively accurately with respect to the ends of the nanowire, e.g., it can be positioned a set distance away from the release or parting zone of a grown wire (See, e.g., Published International Patent Application No. WO 03/085700, incorporated herein by reference in its entirety for all purposes.

Improved Grain Quality Polysilicon Made Using Nanowires

In other aspects, the inventions described herein include the use of nanowire populations as a semiconductor channel element of electronics applications. Although described above as providing the semiconductive component in toto, in other aspects, the nanowire films may be employed as the basis for a modified material that can, in turn be used as a conductive channel element. In particular, a nanowire film may form the basis for producing high grain quality polysilicon (or other semiconductor material) films, by incorporating the nanowires as a seeding element upon which amorphous silicon may be deposited and subsequently annealed.

By way of example, currently, polysilicon is made by depositing a film of amorphous silicon onto a substrate, which is then re-crystallized by heating the film. This heating is either carried out using conventional heating, e.g., in an oven, or in a localized fashion using laser heating methods, which allow precision localized heating. The resulting grains that are formed with this process are crystalline. However, as crystal sizes are increased, film uniformity decreases, as the position of the grains is unknown relative to any devices that are made therefrom. The present invention addresses this issue by using semiconductor nanowires as a seeding component for crystal formation in a polysilicon process, allowing for the production of highly elongated crystalline grains, for example, that easily span source and drain electrodes. Further, by seeding such films in an oriented fashion would further improve film uniformity as it would apply to device fabrication. Although described in terms of silicon nanowires, and amorphous silicon, it will be appreciated that a variety of different semiconductor materials might be used in accordance with the present invention, e.g., Ge, InP, InAs, CdSe, CdTe, or the like. Alternatively, a dense film of nanowires may be used solely to form the polysilicon film, e.g., through annealing of the wire film without the use of amorphous silicon.

Use of Nanowires of the Present Invention in Exemplary Devices and Applications

Numerous electronic devices and systems can incorporate semiconductor or other type devices with thin films of nanowires produced by the methods of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The nanowires produced by the processes of the present invention can also be incorporated in applications requiring a single semiconductor device, and to multiple semiconductor devices. For example, the nanowires produced by the processes of the present invention are particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The nanowires produced by the processes of the present invention are also applicable to smart libraries, credit cards, large area array sensors, and radio-frequency identification (RFID) tags, including smart cards, smart inventory tags, and the like.

The nanowires produced by the processes of the present invention are also applicable to digital and analog circuit applications. In particular, the nanowires produced by the processes of the present invention are useful in applications that require ultra large-scale integration on a large area substrate. For example, a thin film of nanowires produced by the processes of the present invention can be implemented in logic circuits, memory circuits, processors, amplifiers, and other digital and analog circuits.

The nanowires produced by the processes of the present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires produced by the processes of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

Conclusion

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A method of harvesting nanowires, comprising:
providing a population of upstanding core nanowires attached to a surface of a growth substrate;
depositing a first inner shell layer on the population of nanowire cores and overlying the surface of the growth substrate;
depositing a second outer shell layer on the first inner shell layer, wherein the second shell layer is differentially etchable from the first shell layer;
selectively etching at least portions of the second outer shell layer overlying the substrate surface;
selectively etching at least exposed portions of the inner shell layer overlying the substrate surface to expose end portions of the core nanowires in the nanowire population; and
releasing the end portions of the core nanowires to release the nanowires from the growth substrate.

2. The method of claim 1, wherein the first inner shell layer comprises a dielectric material layer.

3. The method of claim 2, wherein the dielectric material layer comprises silicon oxide or silicon nitride.

4. The method of claim 3, wherein the dielectric material layer comprises silicon oxide.

5. The method of claim 2, wherein the dielectric material layer comprises silicon nitride, Ta2O5, TiO2, ZrO2, HfO2, or Al2O3.

6. The method of claim 4, wherein the second outer shell layer comprises a conductive material layer.

7. The method of claim 6, wherein the conductive material layer comprises WN.

8. The method of claim 6, wherein the conductive material layer comprises W, Pt, or highly doped silicon.

9. The method of claim 6, wherein the second outer shell layer is deposited by atomic layer deposition on the inner shell layer.

10. The method of claim 6, wherein selectively etching at least portions of the second outer shell layer overlying the substrate surface comprises using a directional etch step.

11. The method of claim 10, wherein selectively etching at least exposed portions of the inner shell layer overlying the substrate surface comprises exposing the substrate to a buffered oxide etch vapor or wet solution to remove the exposed oxide layer from the substrate surface and from the exposed end portions on the nanowires.

12. The method of claim 1, wherein releasing the end portions of the nanowires comprising etching the end portions.

* * * * *